US006995048B2

(12) United States Patent
Yoneda et al.

(10) Patent No.: US 6,995,048 B2
(45) Date of Patent: Feb. 7, 2006

(54) THIN FILM TRANSISTOR AND ACTIVE MATRIX TYPE DISPLAY UNIT PRODUCTION METHODS THEREFOR

(75) Inventors: Kiyoshi Yoneda, Moriguchi (JP); Tsutomu Yamada, Moriguchi (JP); Shinji Yuda, Moriguchi (JP); Koji Suzuki, Moriguchi (JP)

(73) Assignee: Sanyo Electric Co., Ltd., (JP)

( * ) Notice: Subject to any disclaimer, the term of this patent is extended or adjusted under 35 U.S.C. 154(b) by 12 days.

(21) Appl. No.: 10/333,194

(22) PCT Filed: May 16, 2002

(86) PCT No.: PCT/JP02/04750

§ 371 (c)(1),
(2), (4) Date: Jan. 16, 2003

(87) PCT Pub. No.: WO02/095834

PCT Pub. Date: Nov. 28, 2002

(65) Prior Publication Data

US 2004/0087067 A1  May 6, 2004

(30) Foreign Application Priority Data

May 18, 2001  (JP) ............................. 2001-149453
Mar. 11, 2002  (JP) ............................. 2002-65794

(51) Int. Cl.
  *H01L 21/00* (2006.01)
  *H01L 21/84* (2006.01)
(52) U.S. Cl. ..................... 438/149; 438/585
(58) Field of Classification Search ................ 438/139, 438/149
  See application file for complete search history.

(56) References Cited

U.S. PATENT DOCUMENTS

| 5,508,216 | A  | * | 4/1996  | Inoue ........................ 438/151 |
| 5,757,048 | A  |   | 5/1998  | Inoue ........................ 257/344 |
| 6,100,119 | A  | * | 8/2000  | Jang et al. .................. 438/151 |
| 6,115,097 | A  |   | 9/2000  | Yamazaki .................... 349/151 |
| 6,249,330 | B1 | * | 6/2001  | Yamaji et al. ............... 349/122 |
| 6,653,179 | B1 | * | 11/2003 | Minegishi et al. ........... 438/166 |
| 6,734,940 | B2 | * | 5/2004  | Hirabayashi ................ 349/149 |
| 6,744,069 | B1 | * | 6/2004  | Yamazaki et al. ............ 257/72  |

FOREIGN PATENT DOCUMENTS

JP  2-234134  9/1990
JP  3-201538  9/1991

(Continued)

OTHER PUBLICATIONS

International Search Report.

(Continued)

*Primary Examiner*—George Fourson
*Assistant Examiner*—Fernando L. Toledo
(74) *Attorney, Agent, or Firm*—Cantor Colburn LLP

(57) ABSTRACT

A first contact hole is formed penetrating a gate insulating film, on which a gate electrode is formed and simultaneously a first contact is formed in the first contact hole. A second contact hole penetrating an interlayer insulating film is formed, and a second contact is formed in the second contact hole. A third contact hole is formed penetrating a planarization film, and an electrode is formed in the third contact hole. By using a plurality of contact holes for electrically connecting the electrode and a semiconductor film, the aspect ratio of each contact hole can be reduced, thereby achieving improvement in yield, high-level integration due to a reduction in difference in area between upper and bottom surfaces of the contact, and other advantageous improvements.

12 Claims, 17 Drawing Sheets

FOREIGN PATENT DOCUMENTS

| | | |
|---|---|---|
| JP | 6-151849 | 5/1994 |
| JP | 6-252405 | 9/1994 |
| JP | 6-275650 | 9/1994 |
| JP | 8-236777 | 9/1996 |
| JP | 10-209454 | 8/1998 |
| JP | 11-111993 | 4/1999 |
| JP | 2001023899 | 1/2001 |
| TW | 478003 | 3/2002 |
| WO | WO 01/04939 | 1/2001 |

OTHER PUBLICATIONS

Copy of Office Action for corresponding Korean Patent Application No. 10-2003-7000738 dated Nov. 26, 2004 and its excerpt English translation.

* cited by examiner

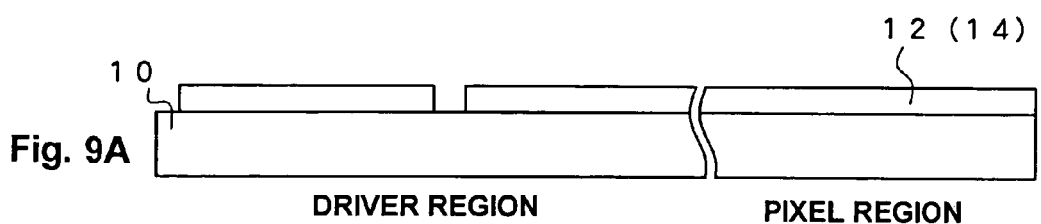

DRIVER REGION    PIXEL REGION

THIN FILM TRANSISTOR AND ACTIVE MATRIX TYPE DISPLAY UNIT PRODUCTION METHODS THEREFOR

TECHNICAL FIELD

The present invention relates to a thin film transistor (hereinafter referred to as a TFT) and an active matrix display device including the TFT, and a manufacturing method thereof.

BACKGROUND ART

Active matrix display devices in which a switching element is formed for each pixel to achieve a high-definition display in liquid crystal display devices are publicly known and organic electroluminescence display devices have recently attracted a great deal of attention.

FIGS. 1A–1I are cross sectional views illustrating the steps of manufacturing an active matrix liquid crystal display device according to a related art.

Step A (FIG. 1A): On an insulating substrate 310, an amorphous silicon (hereinafter referred to as "a-Si") film 320 is formed.

Step B (FIG. 1B): A surface of the a-Si film 320 is irradiated with beams of focused laser light (laser beams) to melt and recrystallize a-Si, thereby forming a polysilicon (hereinafter referred to as "poli-Si") film. Through photolithography and etching, the poli-Si film is patterned as an island, thereby forming a semiconductor film 330.

Step C (FIG. 1C): On the insulating substrate 310 and the semiconductor film 330, a gate insulating film 340 is formed of an $SiO_2$ film as a first insulating film. On the gate insulating film 340, a metal film of chromium (Cr) is formed, and through photolithography and etching a gate electrode 350 is formed on the gate insulating film 340 at a position corresponding to and located over a central portion of the semiconductor film 330.

Step D (FIG. 1D): P-type or N-type impurities are doped to the semiconductor film 330 using the gate electrode 350 as a mask. A heat treatment is performed to activate the doped impurities, thereby forming a source region 330a and a drain region 330b in the semiconductor film 330.

Thus, a poli-Si TFT, which is a semiconductor element, is formed.

Step E (FIG. 1E): On the gate insulating film 340 and the gate electrode 350, a two-layered interlayer insulating film 360 composed of an $SiO_2$ film 360a and an SiN film 360b is formed as a second insulating film.

Step F (FIG. 1F): A plurality of first contact holes 370 are formed penetrating the gate insulating film 340 and the interlayer insulating film 360 to expose the source region 330a and the drain region 330b. In the first contact hole 370 exposing the drain region 330b, wiring 380 is formed of aluminum (Al) extending in a direction perpendicular to the plane of the sheet.

Step G (FIG. 1G): A planarization film 390 is formed of an organic type material on the noted first contact hole 370, the interlayer insulating film 360, and the wiring 380, thereby planarizing the surface.

Step H (FIG. 1H): A second contact hole is formed penetrating the planarization film 390 and exposing the source region 330a. In this second contact hole, a pixel electrode 400 is formed of ITO (indium tin oxide) connected to the source region 330a and spreading over the planarization film 390.

Step I (FIG. 1I): An alignment film 410 for alignment of liquid crystal is formed of polyimide, $SiO_2$, or the like on the pixel electrode 400 and the planarization film 390.

A TFT substrate of the active matrix liquid crystal display device is thus formed. The liquid crystal display device is formed by liquid crystal sandwiched by the TFT substrate and an opposite substrate having a common electrode formed thereon.

According to the above-described manufacturing method, the second contact hole connecting the source region 330a of the TFT and the pixel electrode 400 is formed penetrating the planarization film 390 and the interlayer insulating film 360, and is therefore relatively deep compared to the diameter of the opening, i.e. it has a large aspect ratio. As a result, the planarization film 390 may not be completely removed to reach the source region 330a for forming the second contact hole. On the other hand, when etching is performed for a longer period of time in order to completely remove the planarization film 390, a completely selective etching cannot be performed between the planarization film 390 and the interlayer insulating film 360 and the semiconductor film 330, giving rise to a rough surface of the source region 330a of the semiconductor film 330. Thus, etching adjustment is difficult and errors in depth or size of the contact holes are common, which adversely affects yield.

In addition, because the contact hole is formed through etching utilizing chemical reaction, the area of the contact hole at an upper end exceeds that at the bottom surface. The difference increases as the hole becomes deeper, and therefore a large area is required at the upper end for forming a deep contact hole, preventing enhancement of integration level.

The present invention has been conceived in view of the above-described problems, with the aim of making possible easy and reliable fabrication of a contact hole and achieving increased yields and further enhancement of the integration level.

Another object of the present invention is to prevent curing of a mask material during impurity doping for manufacturing a thin film transistor.

DISCLOSURE OF INVENTION

The present invention has been conceived to achieve the above objects, and has the following characteristics.

The present invention relates to a method of manufacturing a thin film transistor, comprising forming a semiconductor film as an island on an insulating substrate, forming a first insulating film over said insulating substrate and said semiconductor film covering said semiconductor film, forming at least one first contact hole penetrating said first insulating film and exposing part of said semiconductor film, and forming a first conductive film on said first insulating film and in said first contact hole and etching said first conductive film to simultaneously form a gate electrode overlapping part of said semiconductor film and a first contact electrically connected to said semiconductor film in said first contact hole.

According to one aspect of the present invention, the above method of manufacturing a thin film transistor further comprises forming a second insulating film covering said first insulating film, said gate electrode, and said first contact, forming a second contact hole penetrating at least said second insulating film and exposing part of said first contact, and forming a second conductive film on said second insulating film and in said second contact hole and etching a predetermined area to form wiring in a predetermined shape and a second contact, electrically connected to said first contact.

According to another aspect of the present invention, the above method of manufacturing a thin film transistor further comprises forming a second insulating film covering said first insulating film, said gate electrode, and said first contact, forming at least two second contact holes penetrating at least said second insulating film and exposing parts of said first contact and said semiconductor film, and forming a second conductive film on said second insulating film and in said second contact holes and etching a predetermined area to form wiring in a predetermined shape and a second contact, electrically connected to said semiconductor film.

According to a further aspect, the present invention is configured as an active matrix display device using a thin film transistor. More specifically, this aspect of the present invention relates to a method of manufacturing an active matrix display device using a thin film transistor, comprising forming a semiconductor film as an island over an insulating substrate, forming a first insulating film on said insulating substrate and said semiconductor film covering said semiconductor film, forming at least one first contact hole penetrating said first insulating film and exposing part of said semiconductor film, and forming a first conductive film on said first insulating film and in said first contact hole and etching said first conductive film to simultaneously form a gate electrode overlapping part of said semiconductor film and a first contact in said first contact hole electrically connected to said semiconductor film.

According to a further aspect of the present invention, the above method of manufacturing an active matrix display device further comprises forming a second insulating film covering said first insulating film, said gate electrode, and said first contact, forming a second contact hole penetrating at least said second insulating film and exposing part of said first contact, and forming a second conductive film on said second insulating film and in said second contact hole and etching a predetermined area to form wiring in a predetermined shape and a second contact, electrically connected to said first contact.

According to a further aspect of the present invention, the above method of manufacturing an active matrix display device further comprises forming, on said second insulating film, said second contact, and said wiring, a planarization film for planarizing an asperity formed by an underlying structure, forming a third contact hole penetrating said planarization film and exposing said second contact, and forming an electrode on said planarization film, electrically connected to said second contact through said third contact hole.

According to a further aspect of the present invention, the above method of manufacturing an active matrix display device further comprises forming a second insulating film covering said first insulating film, said gate electrode, and said first contact, forming at least two second contact holes penetrating at least said second insulating film and exposing parts of said first contact and said semiconductor film, and forming a second conductive film on said second insulating film and in said second contact holes and etching a predetermined area to form wiring in a predetermined shape and a second contact, electrically connected to said semiconductor film.

According to a further aspect of the present invention, the above method of manufacturing an active matrix display device further comprises forming, on said second insulating film, said second contact, and said wiring, a planarization film for planarizing an asperity formed by an underlying structure, forming a third contact hole penetrating said planarization film and exposing said second contact, and forming an electrode on said planarization film, electrically connected to said second contact through said third contact hole.

According to a further aspect of the present invention, the above method of manufacturing an active matrix display device further comprises forming a second insulating film covering said first insulating film, said gate electrode, and said first contact, forming a second contact hole penetrating said second insulating film and exposing said first contact, forming a second conductive film on said second insulating film and in said second contact hole and etching a predetermined area to form wiring in a predetermined shape electrically connected to said first contact, forming, on said second insulating film, said second contact, and said wiring, a planarization film for planarizing an asperity formed by an underlying structure, forming a third contact hole penetrating at least said planarization film, and forming an electrode on said planarization film, electrically connected to said semiconductor film through said third contact hole.

According to a further aspect of the present invention, in the above method of manufacturing an active matrix display device, said third contact hole penetrates said planarization film and said second insulating film to expose said first contact, and said electrode is electrically connected to said first contact through said third contact hole.

According to a further aspect of the present invention, the above method of manufacturing an active matrix display device further comprises forming a second insulating film covering said first insulating film, said gate electrode, and said first contact, forming a second contact hole penetrating said second insulating film and exposing said first contact and forming a third contact hole penetrating said second insulating film and said first insulating film and exposing said semiconductor film, forming a second conductive film on said second insulating film and in said second contact hole and said third contact hole and etching a predetermined area to form a second contact electrically connected to said first contact and wiring in a predetermined shape electrically connected to said semiconductor film, forming, on said second insulating film, said second contact, and said wiring, a planarization film for planarizing an asperity formed by an underlying structure, forming a fourth contact hole penetrating said planarization film and exposing said second contact, and forming an electrode on said planarization film, electrically connected to said second contact through said fourth contact hole.

According to a further aspect, the present invention relates to a thin film transistor comprising an active layer formed of a semiconductor film including a channel region, a source region, and a drain region, a gate insulating film, a gate electrode, a source electrode, and a drain electrode, wherein said semiconductor film is formed over an insulating substrate, said gate insulating film is formed covering said semiconductor film, said gate electrode is formed on a region of said gate insulating film corresponding to the channel, a first contact hole is formed in at least one of regions of said gate insulating film corresponding to the source and the drain, in said first contact hole formed in at least one of the regions corresponding to the source and the drain, a first contact is filled of a material same as said gate electrode and electrically connected to the corresponding source or drain region of said semiconductor film, and either one or both of said source electrode and said drain electrode is connected to the corresponding source or drain region of said semiconductor film through said first contact.

According to a further aspect of the present invention, in the above thin film transistor, said first contact hole is provided in each of the regions of said gate insulating film corresponding to the source and the drain, said first contact is filled in each of said first contact holes, and said source electrode is connected to the source region of said semiconductor film through the corresponding first contact, while said drain electrode is connected to the drain region of said semiconductor film through the corresponding first contact.

According to a further aspect of the present invention, in the above thin film transistor, said source electrode and said drain electrode are connected correspondingly to the source and drain regions in second contact holes each provided in a region of an interlayer insulating film, covering said first contact and said gate electrode, corresponding to said first contact.

According to a further aspect of the present invention, in the above thin film transistor, said first contact hole is provided in either one of the regions of said gate insulating film corresponding to the source and the drain, said first contact is filled in said first contact hole, and either one of said source electrode and said drain electrode is connected to the corresponding source or drain region of said semiconductor film through said first contact.

According to a further aspect of the present invention, in the above thin film transistor, the other one of said source electrode and said drain electrode is connected to the corresponding drain region or source region of said semiconductor film through a second contact hole provided in corresponding regions of said gate insulating film and an interlayer insulating film formed covering said gate electrode and said gate insulating film to expose a surface of said semiconductor film at a bottom of the second contact hole.

According to a further aspect of the present invention, in the above thin film transistor, said gate electrode and said first contact are formed of a refractory metal material.

According to a further aspect, the present invention relates to an active matrix display device using a thin film transistor comprising an active layer formed of a semiconductor film including a channel region, a source region, and a drain region, a gate insulating film, a gate electrode, a source electrode, and a drain electrode, wherein said semiconductor film is formed over an insulating substrate, said gate insulating film is formed covering said semiconductor film, said gate electrode is formed on a region of said gate insulating film corresponding to the channel, a first contact hole is formed in each of regions of said gate insulating film corresponding to the source and the drain, in at least one of said first contact holes formed in the regions corresponding to the source and the drain, a first contact is filled of a material same as said gate electrode and electrically connected to the corresponding source or drain region of said semiconductor film, and either one or both of said source electrode and said drain electrode is connected to the corresponding source or drain region of said semiconductor film through said first contact.

According to a further aspect of the present invention, in the above active matrix display device, said first contact hole is provided in each of the regions of said gate insulating film corresponding to the source and the drain, said first contact is filled in each of said first contact holes, and said source electrode and said drain electrode are connected correspondingly to the source region and the drain region through second contact holes, each provided in a region of an interlayer insulating film, covering said first contact and said gate electrode, corresponding to said first contact.

According to a further aspect of the present invention, in the above active matrix display device, a planarization insulating film is further formed covering said source electrode and said drain electrode, a third contact hole is formed in a region of said planarization insulating film corresponding to either one of said source electrode and said drain electrode, and in said third contact hole the corresponding one of said source electrode and said drain electrode is electrically connected to a pixel electrode.

According to a further aspect of the present invention, in the above active matrix display device, said first contact hole is provided in either one of the regions of said gate insulating film corresponding to the source and the drain, said first contact is filled in said first contact hole, and either one of said source electrode and said drain electrode is connected to the corresponding source or drain region of said semiconductor film through said first contact.

According to a further aspect of the present invention, in the above active matrix display device, the other one of said source electrode and said drain electrode is connected to the corresponding drain region or source region of said semiconductor film through a second contact hole provided in corresponding regions of said gate insulating film and an interlayer insulating film formed covering said gate electrode and said gate insulating film to expose a surface of said semiconductor film at a bottom of the second contact hole.

According to a further aspect of the present invention, in the above active matrix display device, a planarization insulating film is further formed covering said source electrode and said drain electrode, a third contact hole is formed in a region of said planarization insulating film corresponding to either one of said source electrode and said drain electrode, and in said third contact hole the corresponding one of said source electrode and said drain electrode is electrically connected to a pixel electrode.

According to a further aspect of the present invention, in the above active matrix display device, said gate electrode and said first contact are formed of a refractory metal material.

According to the present invention as described above, electrical connection between a pixel electrode formed on a thick film, such as a planarization film, and a semiconductor film used for an active layer of a thin film transistor and the like is made through, for example, first, second and third contacts filling in first, second and third contact holes formed in stages. As a result, each contact hole can be made as a relatively shallow hole with a small aspect ratio. A shallow contact hole contributes shortening the etching time for providing the hole, simplifying fabrication, reducing the areas of upper and bottom surfaces of each contact, and eliminating differences in areas of the upper and bottom surfaces, leading to enhancement of integration level.

The conductive material used for each contact often has a large selectivity with respect to the film etched away for providing a contact hole, thereby allowing selective etching, and therefore preventing degradation in properties of the film exposed at the bottom surface of the hole due to etching. Because the first contact and the second contact are simultaneously formed with the gate electrode and the wiring, respectively, the above effects can be enjoyed without increasing the number of processing steps.

According to a further aspect, the present invention relates to a method of manufacturing a top gate type transistor in which a gate electrode is formed in a layer overlying an active layer, wherein after said active layer is formed and prior to formation of a gate insulating film covering said active layer, a desired region of said active layer is selectively covered with a resist mask material before doping impurities to said active layer; after said impurities are doped, said resist mask material is removed and then the gate insulating film is formed covering said active layer; and the gate electrode is formed on said gate insulating film.

According to a further aspect, the present invention relates to a method of manufacturing a top gate type transistor in which a gate electrode is formed in a layer overlying an active layer, wherein after said active layer is formed and prior to formation of a gate insulating film covering said active layer, regions of said active layer to be a channel region and a low concentration impurity doped region are selectively covered with a resist mask material and impurities are doped to said active layer at a high concentration; after said impurities are doped at a high concentration, said resist mask material is removed and then the gate insulating film is formed covering said active layer, the gate electrode is formed on said gate insulating film; and, after said gate electrode is formed, impurities are doped to said active layer at a low concentration using said gate electrode as a mask.

According to a further aspect of the present invention, in each of the above methods of manufacturing a top gate type transistor, said active layer is a polycrystalline silicon layer formed by providing and polycrystallizing an amorphous silicon layer.

According to a further aspect of the present invention, in each of the above methods of manufacturing a top gate type transistor, the above impurities doped at a high concentration and a low concentration are n-type (n-conductivity type) impurities.

As described above, according to a further aspect of the present invention, the impurity doping step, or at least the high concentration impurity doping step, is performed prior to the step of forming a gate insulating film, and impurities are directly doped to an active layer of the transistor. As a result, acceleration energy of doped impurities can be lowered to the level just enough to reach a predetermined depth of the active layer. When the acceleration energy of the impurity ions is small, a resist mask is prevented from curing even in the environment where impurities are doped at a high concentration, and can be completely removed after the doping step.

By using a gate electrode as a mask during impurity doping at a low concentration, a channel and a low concentration impurity region can be formed in a self-aligned manner with respect to the gate electrode, thereby allowing formation of a transistor with a small parasitic capacitance.

According to a further aspect, the present invention relates to a method of manufacturing top gate type transistors of different conductivity types, in which a gate electrode is formed in a layer overlying an active layer, wherein said active layer is formed, a gate insulating film is formed covering said active layer, a gate electrode material layer is formed on said gate insulating film and said gate electrode material layer covers the entire active layer in a region for forming a transistor of a first conductivity type, and is patterned to the shape of the gate electrode in a region for forming a transistor of a second conductivity type, and, after patterning said gate electrode material layer, impurities of the second conductivity type are selectively doped to said active layer of said transistor of the second conductivity type using said gate electrode material layer as a mask. After doping said impurities of the second conductivity type, said gate electrode material layer in said region for forming said transistor of the first conductivity type is patterned to the shape of the gate electrode.

When impurities of the different conductivity type are doped, an active layer region is masked with a gate electrode material layer for the transistor that does not cure in high energy impurity doping environment or leave any residue after the stripping step, so that the gate electrode material layer used as a mask can accurately be patterned to a desired shape of the gate electrode after high concentration impurity doping. Further, because in each of the transistors of the first and second conductivity types impurities are doped using their own gate electrode as a mask, the gate electrode and the channel region are self-aligned, thereby allowing formation of transistors with a small parasitic capacitance.

According to a further aspect, the present invention relates to a method of manufacturing top gate type transistors of different conductivity types, in which a gate electrode is formed in a layer overlying an active layer, wherein after said active layer is formed and prior to formation of a gate insulating film covering said active layer, a resist mask is formed for covering a channel formation region of said active layer in a region for forming a transistor of a first conductivity type, and an active layer formation region in a region for forming a transistor of a second conductivity type, and then impurities of the first conductivity type are doped to said active layer. After said impurities of the first conductivity type are doped, said resist mask is removed, and the gate insulating film covering said active layer is formed. A gate electrode material layer is then formed on said gate insulating film, and said gate electrode material layer covers the entire active layer in said region for forming the transistor of the first conductivity type, and is patterned to the shape of the gate electrode in said region for forming the transistor of the second conductivity type, and after said gate electrode material layer is patterned, impurities of the second conductivity type are doped to said active layer using said gate electrode material layer as a mask. After said impurities of the second conductivity type are doped, said gate electrode material layer in said region for forming said transistor of the first conductivity type is patterned to the shape of the gate electrode.

According to a further aspect, the present invention relates to a method of manufacturing top gate type transistors of different conductivity types, in which a gate electrode is formed in a layer overlying an active layer, wherein after said active layer is formed and prior to formation of a gate insulating film covering said active layer, a resist mask is formed covering a channel formation region of said active layer and a low concentration impurity doped region formed adjacent to said channel formation region in a region for forming a transistor of a first conductivity type, and an active layer formation region in a region for forming a transistor of a second conductivity type, and then impurities of the first conductivity type are doped to said active layer at a high concentration. After said impurities of the first conductivity type are doped at a high concentration, said resist mask is removed and the gate insulating film covering said active layer is formed, a gate electrode material layer is formed on said gate insulating film, and said gate electrode material layer covers the entire active layer in said region for forming the transistor of the first conductivity type and is patterned to the shape of the gate electrode in said region for forming the transistor of the second conductivity type. After patterning said gate electrode, impurities of the second conductivity type are doped to said active layer at a high concentration using said gate electrode as a mask, and, after said gate electrode material layer in said region for forming said transistor of the first conductivity type is patterned to the shape of the gate electrode, said impurities of the first conductivity type are doped to said active layer at a low concentration using said gate electrode as a mask.

According to a further aspect of the present invention, in the above method of manufacturing top gate type transistors, said impurities of the first conductivity type are n-conductivity type impurities, and said impurities of the second conductivity type are p-conductivity type impurities.

As described above, the step of doping impurities of a first conductivity type, especially the high concentration impurity doping step, is performed prior to the step of forming a gate insulating film, and impurities are directly doped to an active layer of the transistor. As a result, acceleration energy of doped impurities can be lowered to the level just enough to reach a predetermined depth of the active layer. When the acceleration energy of the impurity ions is small, a resist mask is prevented from curing even in an environment in which impurities are doped at a high concentration, and can be completely removed after the doping step. Further, at the step of doping impurities of the other conductivity type (impurities of the second conductivity type), the active layer is masked with a material layer for its gate electrode. As described above, the gate electrode material layer does not lead to the problem of curing, which would make it harder to remove, even though it is exposed to high concentration impurity doping at a high energy. As a result, the resist mask is not exposed to high energy impurity doping, and the gate electrode material layer is used as a mask during impurity doping at a high energy, thereby enabling formation of each transistor without any residual mask in a device wherein transistors of different conductivity types are simultaneously formed.

Further, as impurities of the first conductivity type at a low concentration are doped using as a mask a gate electrode produced by patterning to a predetermined shape the gate electrode material layer used as a mask during doping of the second conductivity type impurities, a channel and a low concentration impurity region can be formed in a self-aligned manner with respect to the gate electrode, thereby enabling formation of transistors having small parasitic capacitances.

BRIEF DESCRIPTION OF THE DRAWINGS

FIGS. 9A, 9B, and 9C are views illustrating the steps of manufacturing the TFT according to the fourth embodiment of the present invention.

BEST MODE FOR CARRYING OUT THE INVENTION

Figure 1A:
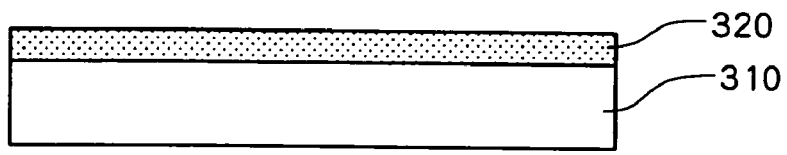
FIGS. 1A, 1B, 1C, 1D, 1E, 1F, 1G, 1H, and 1I are cross sectional views illustrating the steps of manufacturing a TFT substrate in an active matrix display device according to a related art.
Figure 1B:
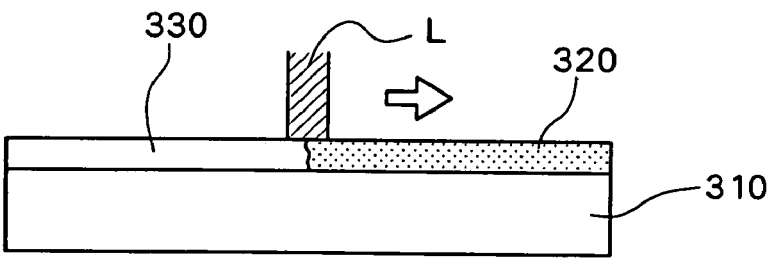
Figure 1C:
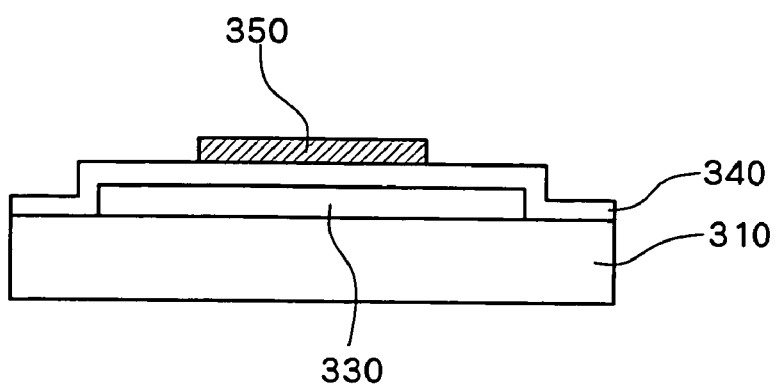
Figure 1D:
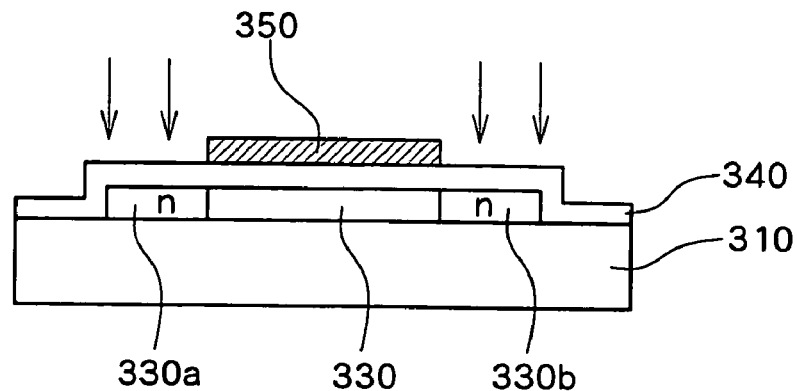
Figure 1E:
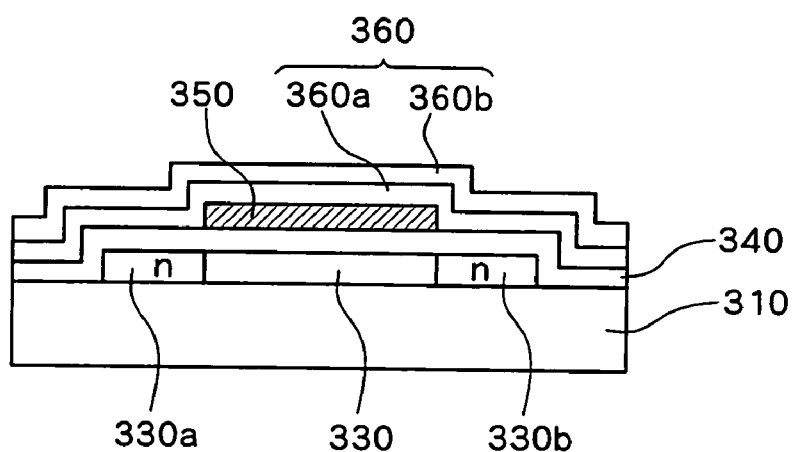
Figure 1F:
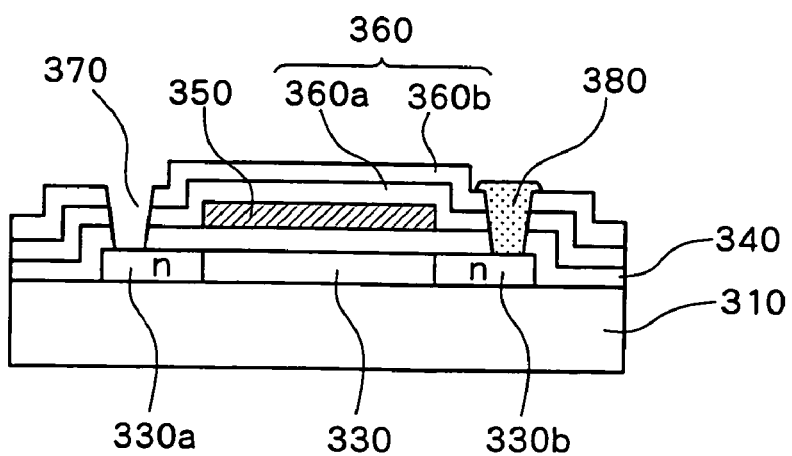
Figure 1G:
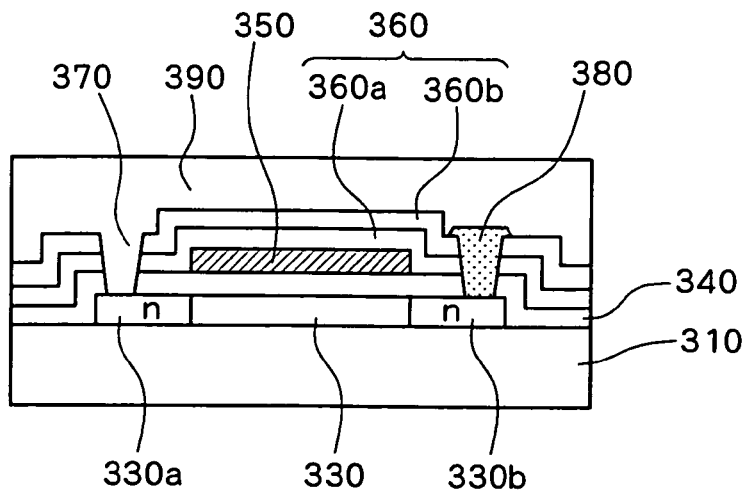
Figure 1H:
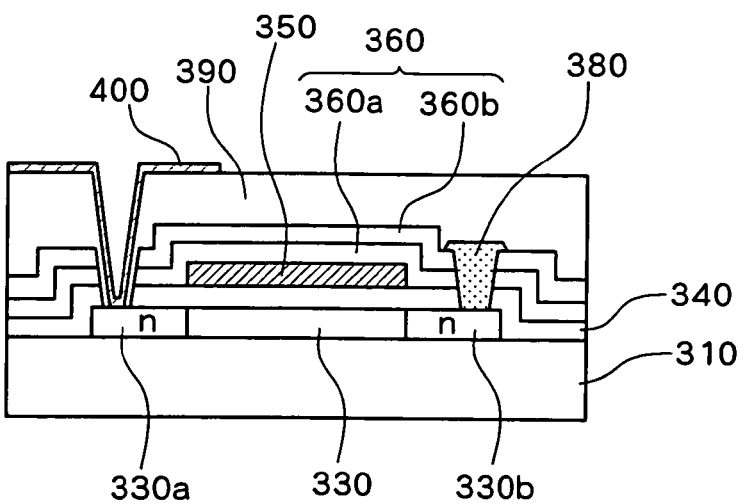
Figure 1I:
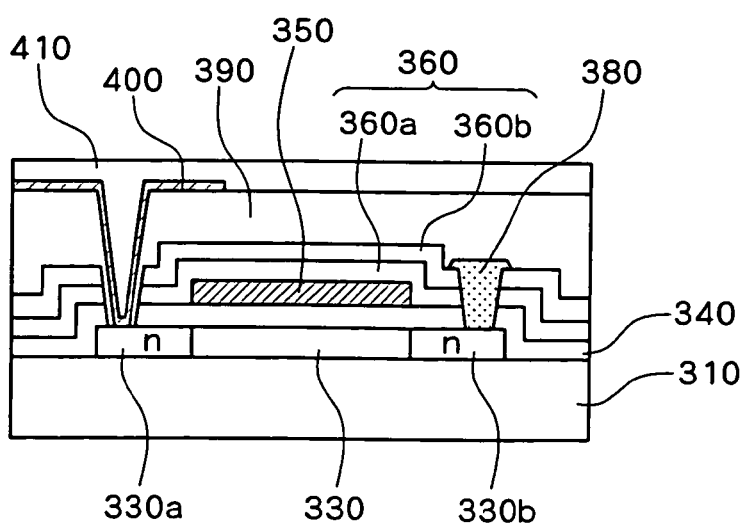

Best modes of the present invention (hereinafter referred to as embodiments) will now be described with reference to the accompanying drawings.

First Embodiment

FIGS. 2A–2M, and FIG. 3 illustrate a method of manufacturing an active matrix display device according to a first embodiment of the present invention.

Step 1 (FIG. 2A): Over the entire surface of an insulating substrate 1 of quartz, non-alkaline glass, or the like, an a-Si film 2 is formed by plasma CVD (chemical vapor deposition) using gas including $SH_4$ (silane), $Si_2H_6$ (disilane), or the like.

Step 2 (FIG. 2B): The surface of the a-Si film 2 is irradiated with a laser beam L for annealing, thereby melting and recrystallizing a-Si to form a poli-Si semiconductor film 3. Because the grain size of poli-Si according to the laser irradiation energy density and the number of times a laser is irradiated, the energy density of the laser beam L is optimized to provide the maximum grain size.

Step 3 (FIG. 2C): A photoresist film is formed on the semiconductor film 3 for light exposure. The portion of the photoresist film exposed to light is removed, leaving only the portion shielded by the mask, whereby the film is patterned as an island. The region of the semiconductor film 3 that is not covered with the photoresist film is removed, thereby patterning the semiconductor film 3 and the photoresist film as an island. The film is masked so as to expose opposing ends of the remaining photoresist film, which is again exposed to light, thereby removing the opposing ends of the light-exposed photoresist film to form a resist 4. Impurities are doped to the region of the semiconductor film 3 uncovered with the resist 4. P-type or N-type impurities are selected as the impurities to be doped depending on the type of the TFT to be formed. In the following description, N-type impurities are selected as an example. After impurity doping, the resist 4 is removed. The portion of the semiconductor film 3 covered with the resist 4 serves as a channel region 3ch. The semiconductor film 3 having the impurities thus doped is annealed according to RTA (rapid thermal anneal) method. The impurities are activated by annealing according to RTA, thereby producing a source region 3s and a drain region 3d.

Step 4 (FIG. 2D): On the insulating substrate 1 and the semiconductor film 3, a gate insulating film 5 of an $SiO_2$ film is provided as a first insulating film in thickness of 1000 Å through plasma CVD at a temperature of 350° C.

Step 5 (FIG. 2E): First contact holes 6 (6s and 6d) penetrating the gate insulating film 5 and exposing the source region 3s and the drain region 3d are formed through photolithography and etching.

Step 6 (FIG. 2F): On the gate insulating film 5 and the first contact hole 6, a metal film made of a refractory metal, such as chromium (Cr) or Molybdenum (Mo), is formed in thickness of 2000 Å as a first conductive film by sputtering. Through photolithography and etching, a gate electrode 7g is formed in the region corresponding to and located over the channel region 3ch of the gate insulating film 5, and first contacts 7s and 7d are simultaneously formed of the same material as the gate electrode 7g to fill in the first contact holes 6 (6s and 6d).

Step 7 (FIG. 2G): On the gate insulating film 5, the gate electrode 7g, and the first contacts 7s and 7d, an interlayer insulating film 8 composed of an $SiO_2$ film 8a and an SiN film 8b is formed by plasma CVD. The $SiO_2$ film and the SiN film are formed in thickness of 2000 Å and 1000 Å, respectively.

Step 8 (FIG. 2H): Through photolithography and etching, second contact holes 9 (9s and 9d) are formed penetrating the interlayer insulating film 8 and exposing the first contacts 7s and 7d. It should be noted that, because the first contacts 7s and 7d are made of metal, selective etching can be performed with a sufficiently large ratio with respect to the $SiO_2$ film and the SiN film, and the first contacts 7s and 7d function as etching stoppers. Consequently, the interlayer insulating film can be etched for a sufficient time, thereby completely removing the interlayer insulating film 8 in the second contact hole 9.

Step 9 (FIG. 2I): On the interlayer insulating film 8 and the second contact hole 9, a metal film made of aluminum (Al) or the like and having a thickness of 3000 Å is formed by sputtering as a second conductive film. A second contact 13 (a source electrode 13s in this example) is formed in the second contact hole 9s through photolithography and etching. Simultaneously, the second contact 13 (wiring, i.e. wiring 13d also functioning as a drain electrode) extending in a direction perpendicular to the plane of the sheet is formed in the second contact hole 9d.

Step 10 (FIG. 2J): On the interlayer insulating film 8 and the second contacts 13 (13s and 13d), a planarization insulating film 26 of an organic type material is formed, thereby filling concave portions produced by the second contacts 13 to planarize the surface.

Step 11 (FIG. 2K): Through further photolithography and etching, a third contact hole 11 is formed penetrating the planarization film 26 and exposing the second contact 13s. In this case also, the selection ratio is sufficient and the bottom surface will not be rough because the second contact 13s located at the bottom of the contact hole 11 is metal. In addition, because an opening is only required in the planarization film 26, the third contact hole 11 can be made shallower, contributing to a smaller difference in area (difference in diameter) between an upper end and the bottom surface of the hole.

Step 12 (FIG. 2L): A transparent conductive film of, for example, ITO is formed on the planarization film 26 and the third contact hole 11. Through photolithography and etching, a pixel electrode 40 electrically connected to the second contact 13s and spreading over the planarization film 26 is formed at the third contact hole 11.

Step 13 (FIG. 2M): An alignment film 14 for alignment of liquid crystal is formed of polyimide, $SiO_2$, or the like on the planarization film 26 and the pixel electrode 40.

Thus, formation of a TFT substrate is completed on one side of an active matrix liquid crystal display device provided with TFTs.

Step 14 (FIG. 3): On an opposite substrate 41 which is an insulating substrate formed of silica glass or non-alkaline glass, an opposite electrode 43, which is a transparent electrode including an ITO film or the like, is formed over the entire substrate surface. On this electrode, an alignment film 45 for alignment of liquid crystal is then formed of polyimide, $SiO_2$, or the like. The opposite electrode 41 is disposed opposite to the above-described TFT substrate, and the two substrates are bonded by an adhesive resin sealing agent 47 applied between and around the TFT substrate and the opposite substrate 41. Liquid crystal 35 is filled between the substrates, thereby finishing formation of an active matrix liquid crystal display device.

According to the present embodiment, an electrical contact structure between the pixel electrode (the third contact) 40 and the semiconductor film 3 is a structure made in stages using the first contact 7s, the second contact 13 (the source contact 13s in this example), and the third contact 40. An electrical contact structure between the wiring 13 (also functioning as a drain electrode in this example) and the semiconductor film 3 is a structure made in stages using the first contact 7d, and the second contact 13d. Such a staged contact structure allows each contact hole to be formed as a shallow hole because no deep contacts are necessary, and the contacts filling in the contact holes need not be thick.

For example, in Step 4, only the gate insulating film 5 in thickness of 1000 Å is opened for forming the first contact hole 6. As a result, even when an etching time a sufficiently long to etch through the gate insulating film 5 is provided, a small aspect ratio of the first contact hole 6 can be maintained and errors in depth can be reduced, so that the surface properties of the semiconductor film 3 will not be significantly degraded. Further, the number of steps is not increased because the first contacts 7s and 7d are formed of the same material as, and simultaneously with, the gate electrode 7g. Also at Step 8, only the interlayer insulating film 8 in thickness of 3000 Å is etched for forming the second contact hole 9. Because the second contact 13s is simultaneously formed with the wiring 13d, the number of steps is not increased also for this contact.

As a result, according to the present embodiment, each of the contact holes 6, 9, and 11 can be made as a shallow hole with a smaller aspect ratio as compared with the contact hole 370 in the related art without increasing the number of overall manufacturing steps, so that the area of an upper surface of each contact can be reduced as compared with the related art, thereby improving the integration level.

Second Embodiment

Figure 4:
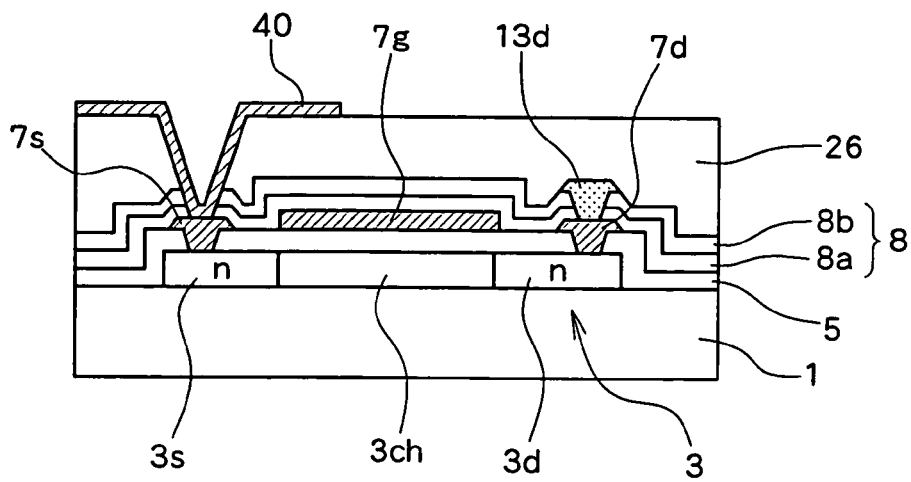
FIG. 4 is a cross sectional view illustrating the TFT substrate in the active matrix display device according to a second embodiment of the present invention.

A second embodiment will next be described. FIG. 4 is a cross sectional view of a TFT substrate formed by manufacturing steps according to the second embodiment. The steps up to Step 7 are the same as those in the first embodiment illustrated in FIGS. 2A–2G, and therefore description thereof will not be repeated.

Step 8: Through photolithography and etching, a second contact hole 9 (9d) is formed penetrating the interlayer insulating film 8 and exposing the first contact 7d.

Step 9: On the interlayer insulating film 8 and the second contact hole, a metal film in thickness of 3000 Å is formed as a second conductive film by sputtering, to form wiring 13d extending in a direction perpendicular to the plane of the sheet in the second contact hole by photolithography and etching.

Step 10: The planarization film 26 is formed covering the interlayer insulating film 8 and the wiring 13d.

Step 11: Through photolithography and etching, a third contact hole is formed penetrating the planarization film 26 and the interlayer insulating film 8, and exposing the first contact 7s at the bottom.

Step 12: A transparent conductive film is formed on the planarization film 26 and the third contact hole. Through photolithography and etching, the pixel electrode 40 electrically connected to the first contact 7s and spreading over the planarization film 26 is formed in the third contact hole.

The pixel electrode 40 and the first contact 7s may thus be directly connected, as illustrated in FIG. 4. However, by forming the second contact hole 9 in the interlayer insulating film 8 and the second contact in the hole as in the first embodiment, the third contact hole need not penetrate through the interlayer insulating film at Step 10, resulting in a hole shallower by its thickness, i.e. 3000 Å, so that the effects of the present invention can surely be enjoyed.

While two first contacts (7s and 7d) are formed for the source and drain regions for each TFT in the first and second embodiments, the present invention is not limited to such a configuration. Only one first contact may be provided for either the source or drain region, or more than two contacts may be provided.

Third Embodiment

Figure 5:
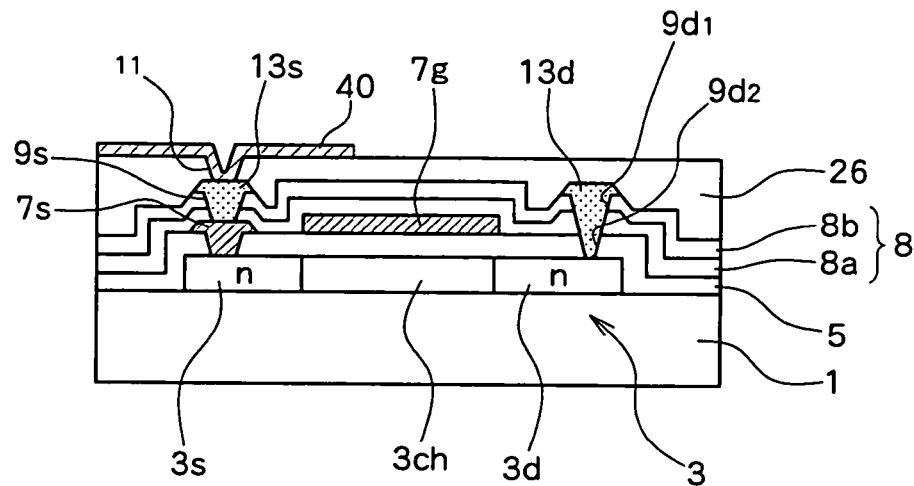
FIGS. 5 and 6 are cross sectional views illustrating the TFT substrate in the active matrix display device according to a third embodiment of the present invention.
Figure 6:
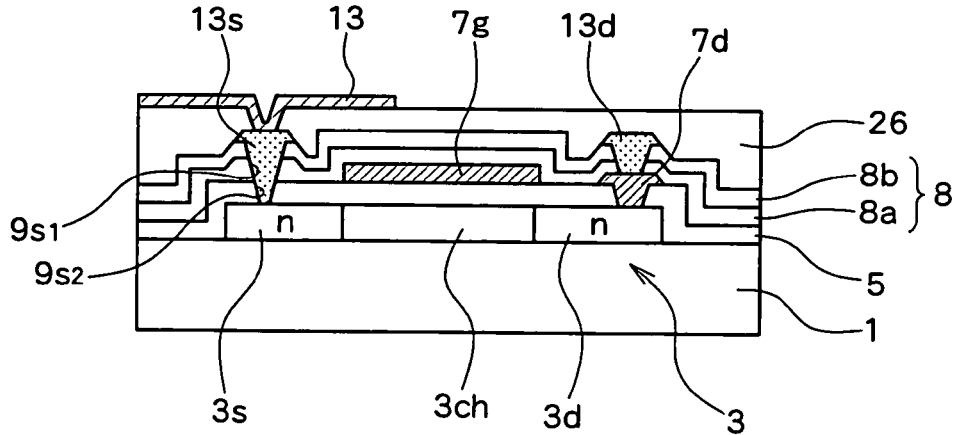

A third embodiment, in which the number of first contacts for each TFT is different from those in the above-described first and second embodiments, will next be described. FIGS. 5 and 6 are cross sectional views of the TFT substrate formed by manufacturing steps according to the third embodiment. The manufacturing steps up to Step 4 are the same as those in the first embodiment illustrated in FIGS. 2A–2D, and therefore description thereof will not be repeated.

Step 5: Through photolithography and etching, only the first contact hole 6s is formed penetrating the gate insulating film 5 and exposing part of the source region 3s illustrated in FIG. 2E.

Step 6: On the gate insulating film 5 and the first contact hole, a metal film is formed as a first conductive film in thickness of 2000 Å by sputtering. Through photolithography and etching, the gate electrode 7g is formed on the region of the gate insulating film 5 corresponding to and located on the channel region 3ch. Simultaneously, the first contact 7s is formed of the same material as the gate electrode 7g in the first contact hole 6s (see FIG. 2F).

Step 7: On the gate insulating film 5 and the first contact 7s, the interlayer insulating film 8 including stacked layers of the $SiO_2$ film 8a and the SiN film 8b is formed by plasma CVD.

Step 8: Through photolithography and etching, the second contact hole 9s is formed penetrating the interlayer insulating film 8 and exposing only the first contact 7s illustrated in FIG. 2H. Simultaneously, a second contact hole $9d_1$ penetrating the interlayer insulating film 8 is formed in the region of the interlayer insulating film 8 corresponding to the drain region 3d of the semiconductor film 3. Further, through photolithography and etching, a second contact hole $9d_2$ is formed penetrating the gate insulating film 5 and exposing the drain region 3d of the semiconductor film 3 (see FIG. 5).

Step 9: On the interlayer insulating film 8 and the second contact holes 9s, $9d_1$, and $9d_2$, a metal film is formed in thickness of 3000 Å as a second conductive film by sputtering, thereby forming the second contact 13s filling in the second contact hole 9s, and the wiring 13d filling in the second contact holes $9d_1$ and $9d_2$ and extending in a direction perpendicular to the plane of the sheet, as illustrated in FIG. 5.

Step 10: The planarization film 26 is formed on the interlayer insulating film 8, the second contact 13s, and the wiring 13d.

Step 11: Through photolithography and etching, the third contact hole 11 is formed penetrating the planarization film 26 and exposing the second contact 13s.

Step 12: A transparent conductive film is formed on the planarization film 26 and the third contact hole 11. Through photolithography and etching, the pixel electrode 40 is formed filling in the third contact hole 11, contacting the second contact 7s, and spreading over the planarization film 26.

Thus, as illustrated in FIG. 5, the wiring 13d and the drain region 3d may directly be connected through the second contact holes $9d_1$ and $9d_2$. Alternatively, as opposed to the configuration in FIG. 5, the second contact 13s and the source region 3s may be directly connected through the second contact holes $9s_1$ and $9s_2$, as illustrated in FIG. 6.

While active matrix liquid crystal display devices are described as an example in the above embodiments, the present invention can be practiced in other active matrix devices using TFTs. For example, the present invention can be applied to TFTs for operating EL elements in active matrix display devices of other types, such as an EL display device. The present invention can be applied not just to display devices, but also to image sensors, fingerprint sensors, and the like.

While in the first to third embodiments described above the source region is connected to the pixel electrode 40 through the contact, the reliable contact can be achieved also in a structure where the drain region is connected to the pixel electrode 40 through the contact by employing a similar staged contact structure with a contact hole having a small aspect ratio. Further, in some circuit configurations TFTs are not directly connected to the pixel electrode. For such TFTs, the second contact 13 is integral with a source electrode or wiring (13s) or a drain electrode or wiring (13d).

Fourth Embodiment

Figure 2A:
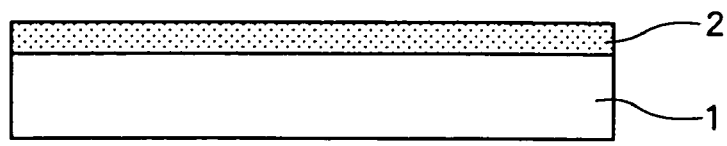
FIGS. 2A, 2B, 2C, 2D, 2E, 2F, 2G, 2H, 2I, 2J, 2K, 2L, and 2M are cross sectional views illustrating the steps of manufacturing a TFT substrate in an active matrix display device according to a first embodiment of the present invention.
Figure 2B:
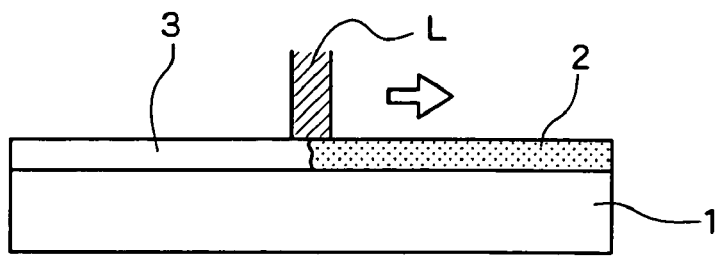
Figure 2C:
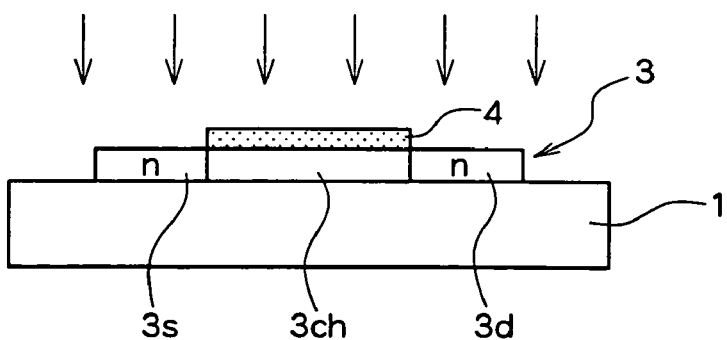
Figure 2D:
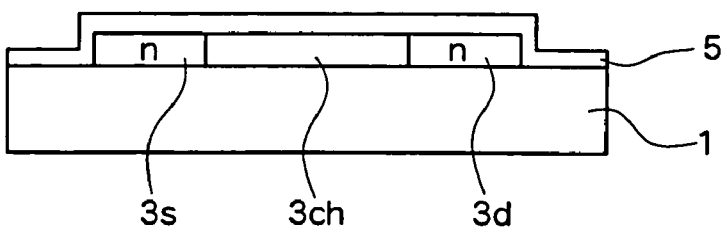
Figure 2E:
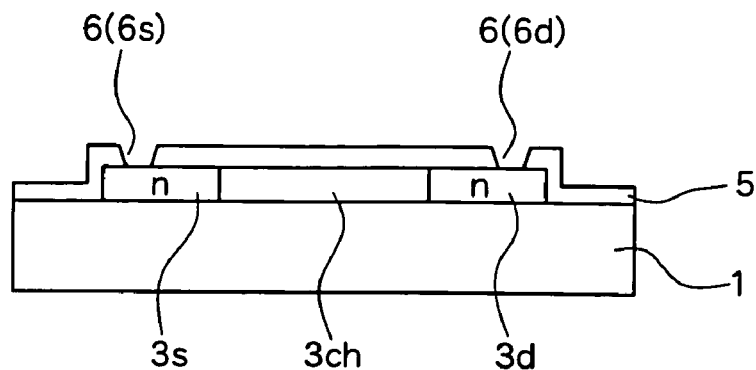
Figure 2F:
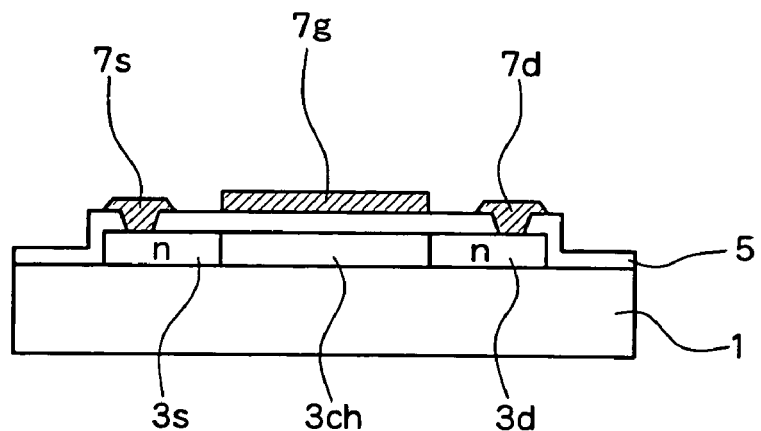
Figure 2G:
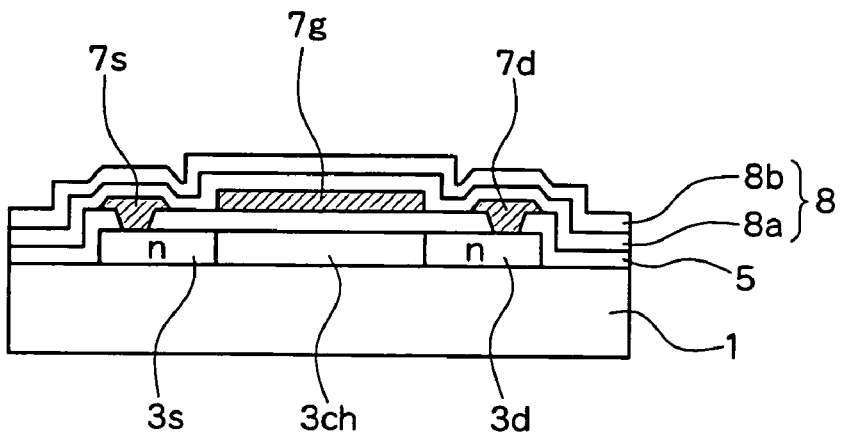
Figure 2H:
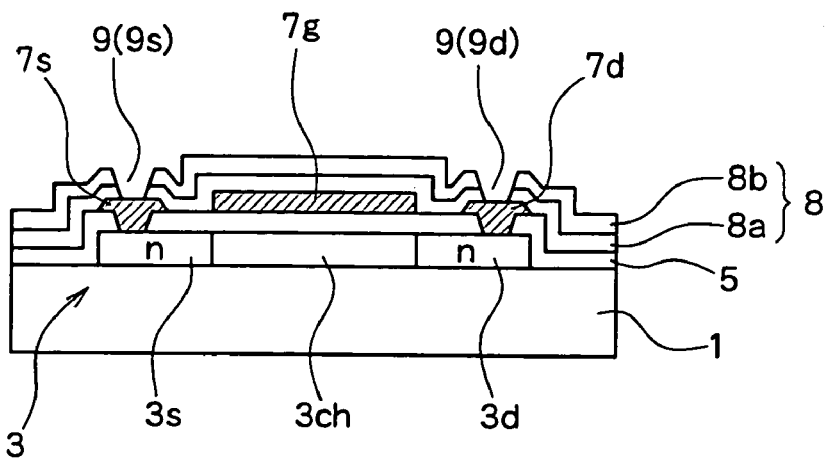
Figure 2I:
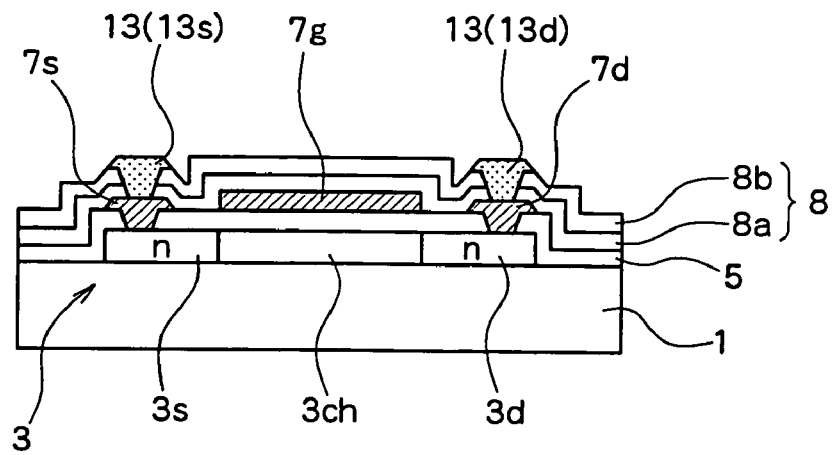
Figure 2J:
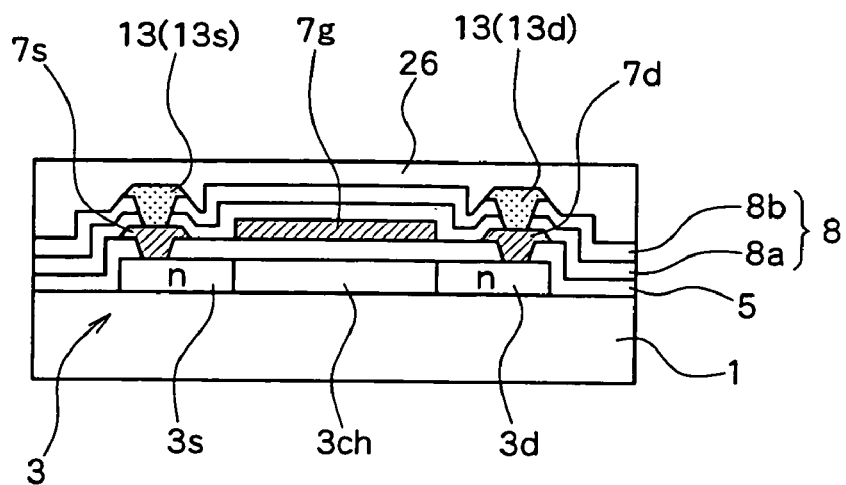
Figure 2K:
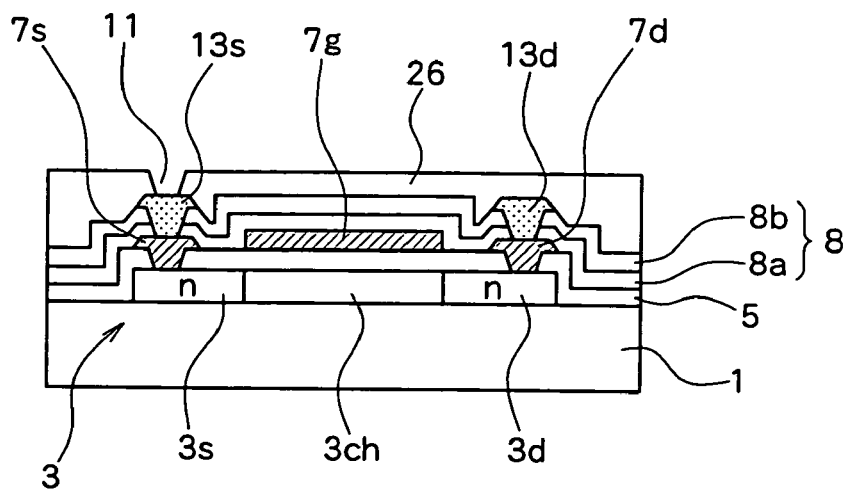
Figure 2L:
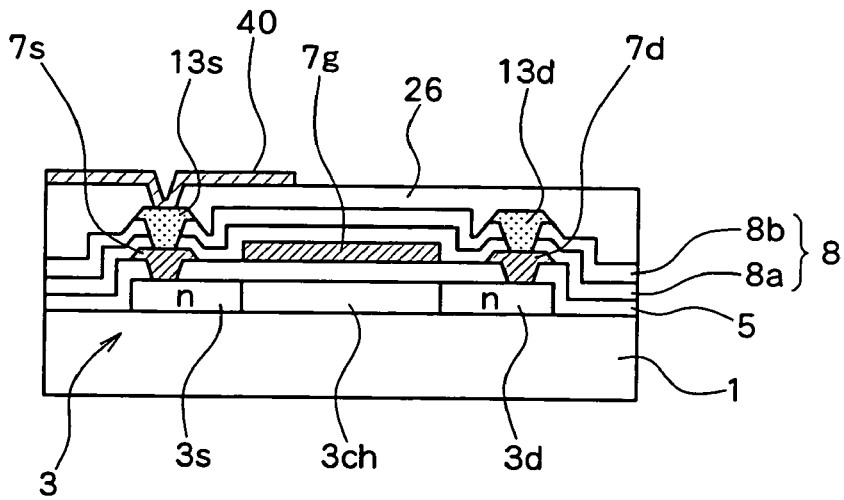
Figure 2M:
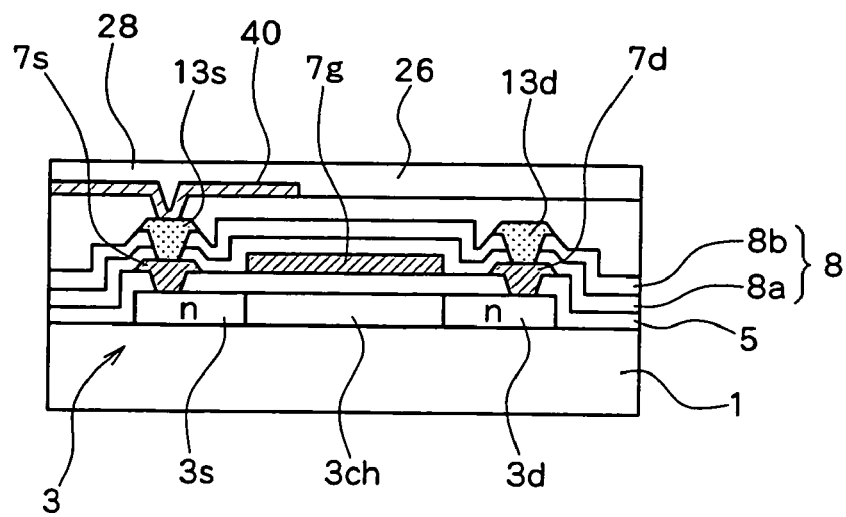
Figure 3:
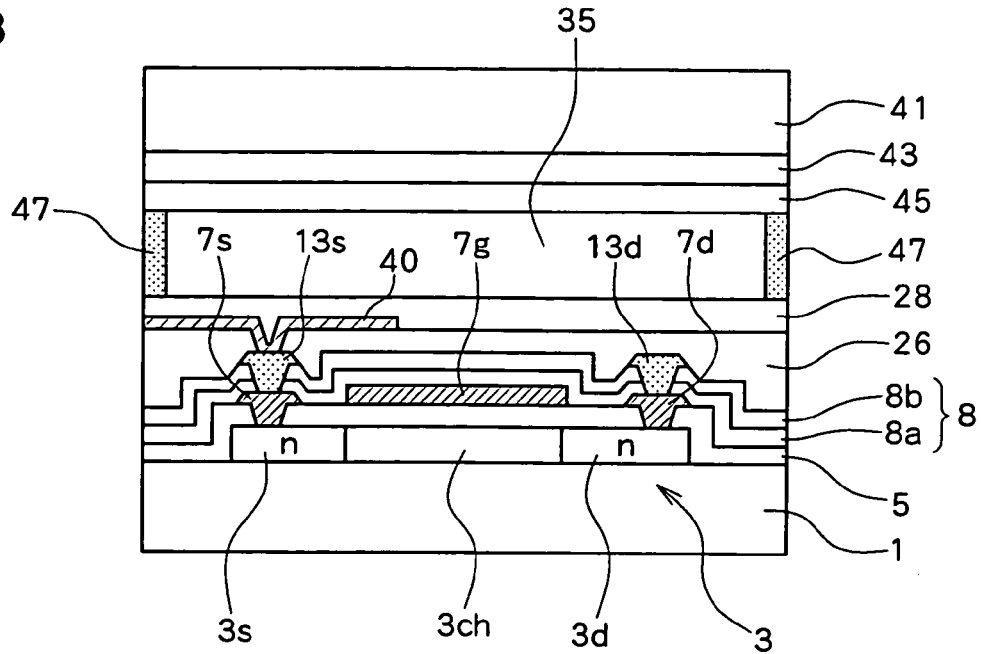
FIG. 3 is a cross sectional view illustrating the active matrix display device according to the first embodiment of the present invention.

A fourth embodiment of the present invention will next be described. In the above-described first embodiment, impurity doping into the semiconductor film 3 is performed before forming the gate insulating film 5, as illustrated in FIGS. 2C and 2D. Also in this fourth embodiment, impurity doping into an active layer of a TFT, especially the step of doping high concentration impurities, is performed before forming the gate insulating film similarly to the first embodiment. By doping impurities prior to formation of the gate insulating film, high impurity acceleration energy for causing impurities to penetrate the gate insulating film and reach the underlying active layer becomes unnecessary, thereby preventing the resist layer acting as an impurity doping mask from curing more than necessary.

The above-described TFT is well known as a switching element formed for each pixel of active matrix display devices. Among such TFTs, the so-called poli-Si TFT having the active layer formed of poli-Si has better response than TFTs having the active layer of amorphous silicon (a-Si) because of high conductivity, and contributes to a smaller element area because the channel, source and drain regions can be formed in a self-aligned manner in the active layer using the gate electrode, and to easier fabrication of a CMOS (complementary metal oxide semiconductor) circuit. As a result, the poli-Si TFT excels as a switch for high-resolution displays, and makes it possible to form, on a substrate where pixel TFTs are formed, a CMOS circuit including similar TFTs, so that a driver circuit for driving a display unit can be included.

The poli-Si has many defects in the semiconductor film (in the crystal and its grain boundary) unlike monosilicon Si. On the other hand, an n-channel (n-ch) TFT having phosphorous (P) or the like doped therein as impurities is often used as one TFT of a CMOS circuit in a driver circuit and as a pixel TFT. The n-ch TFT used as a pixel TFT suffers from a problem of leakage current through the above-described defect in poli-Si trapping carriers. While a poli-Si TFT formed at a low temperature process has advantageous characteristics allowing formation on an inexpensive glass substrate and fabrication of large displays at a low cost, a gate insulating film as fine as a thermal oxidation film cannot be obtained because it is also formed at a low temperature. As a result, the n-ch TFTs used for a peripheral driver circuit suffer from degradation in characteristics due to hot carriers (electrons). For the above-described reasons, for the n-ch low temperature poli-Si TFT an LDD (lightly doped drain) configuration in which an area doped with impurities at a low concentration (i.e. lightly doped area) is formed between the drain and channel regions is employed.

Figure 7A:
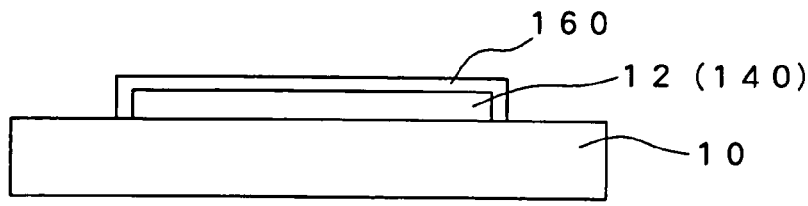
FIGS. 7A, 7B, 7C, 7D, and 7E illustrate the steps of manufacturing a TFT according to a related art.

FIGS. 7A–7E illustrate manufacturing steps of a poli-Si TFT of the LDD configuration employed for a pixel TFT of an LCD according to a related art. On a glass substrate 10, an a-Si layer 12 is first formed, and polycrystallized through laser annealing. The produced poli-Si layer is patterned to the shape of an active layer 140 for each TFT, and a gate insulating film 160 of $SiO_2$ or the like is formed covering the active layer 140 (FIG. 7A).

Figure 7B:
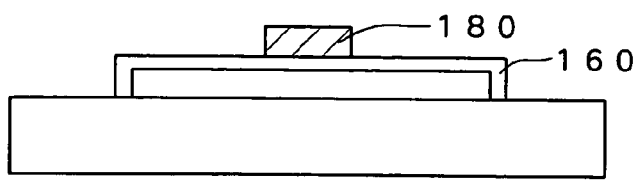
Figure 7C:
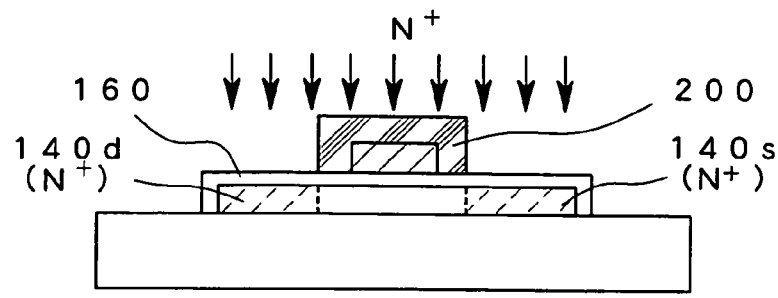

After formation of the gate insulating film 160, a gate electrode material is provided and patterned to the shape of a gate electrode 180, as illustrated in FIG. 7B. After forming a resist layer 200 over the entire substrate surface, the resist layer 200 is selectively removed through photolithography so that the resist layer 200 is left extending longer than the length (horizontal direction in the figure) of the gate electrode 180 by a predetermined distance to cover the electrode, as illustrated in FIG. 7C. When the driver circuit is integrated on the same substrate, the active layer of a p-channel TFT in the CMOS circuit is also covered with the resist layer 200. Using the remaining resist layer 200 as a mask, impurities, such as phosphorous, are doped at a high concentration into the active layer 140 through the gate insulating film 160. Consequently, the region of the active layer 140 that is not covered with the mask is doped with n-type impurities at a high concentration, thereby forming high concentration impurity regions ($N^+$ regions) which will act as source and drain regions 140s and 140d.

Figure 7D:
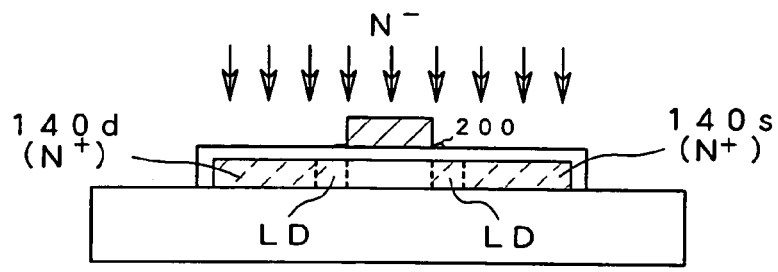
Figure 7E:
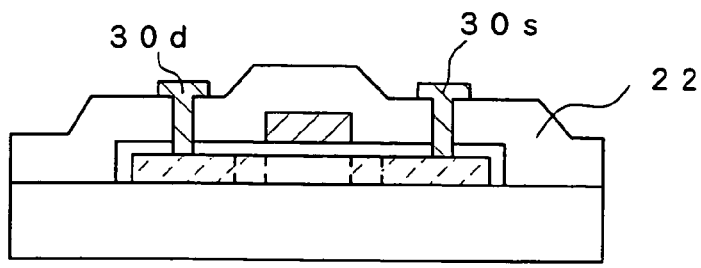

As illustrated in FIG. 7D, the resist layer 200 employed as a mask is removed, and impurities, such as phosphorous, are doped into the active layer 140 at a low concentration using the exposed gate electrode 180 as a mask. As a result, a low concentration impurity (lightly doped; LD) region ($N^-$ region) is formed on either side of an undoped intrinsic region immediately below the gate electrode 180 of the active layer 140 between the intrinsic region and the $N^+$ region formed at the initial high concentration impurity doping step. The impurities doped into the active layer 140 are activated later by an annealing process.

After the activating process, an interlayer insulating film 22 is formed covering the entire substrate including the gate electrode 180, and contact holes are formed penetrating the regions of the interlayer insulating film 22 and the gate insulating film 160 corresponding to the source and drain regions 140s and 140d. The electrode and wiring materials are provided and patterned, thereby forming a source electrode 30s and a drain electrode 30d connected to the source region 140s and the drain region 140d, respectively, at the above-described contact holes.

Through the above-described method, top gate type TFTs of the LDD configuration providing high on-current and low off-current with uniform characteristics are implemented.

When the TFT of the LDD structure is manufactured through the above-described method, formation of the high concentration impurity regions (140s and 140d) requires impurities accelerated at a high energy so as to reach the active layer 140 through the gate insulating film 160, as illustrated in FIG. 7C.

However, when the high concentration impurities are doped at a high acceleration, the impurities are also doped in a large amount and at a high acceleration into the resist layer 200 employed as a mask, thereby curing a commonly-used resist resin. When the resist layer 200 is cured, it is likely to leave some residue when the resist layer 200 must be removed for the next step of forming the LD region. Reducing the residual resist requires the time to strip off the resist, and such residual resist adversely affects the characteristics, reliability, and yield of the device.

On the other hand, according to a method of this fourth embodiment described hereinafter, curing of the layer serving as a mask for impurity doping can be prevented.

A TFT according to the fourth embodiment of the present invention can be used for either or both of a pixel TFT as a switching element used for each pixel in an active matrix display device (such as an LCD and an organic electroluminescence display device), or a TFT of the CMOS configuration in the driver circuit simultaneously formed as the switching element on the same substrate.

Figure 8:
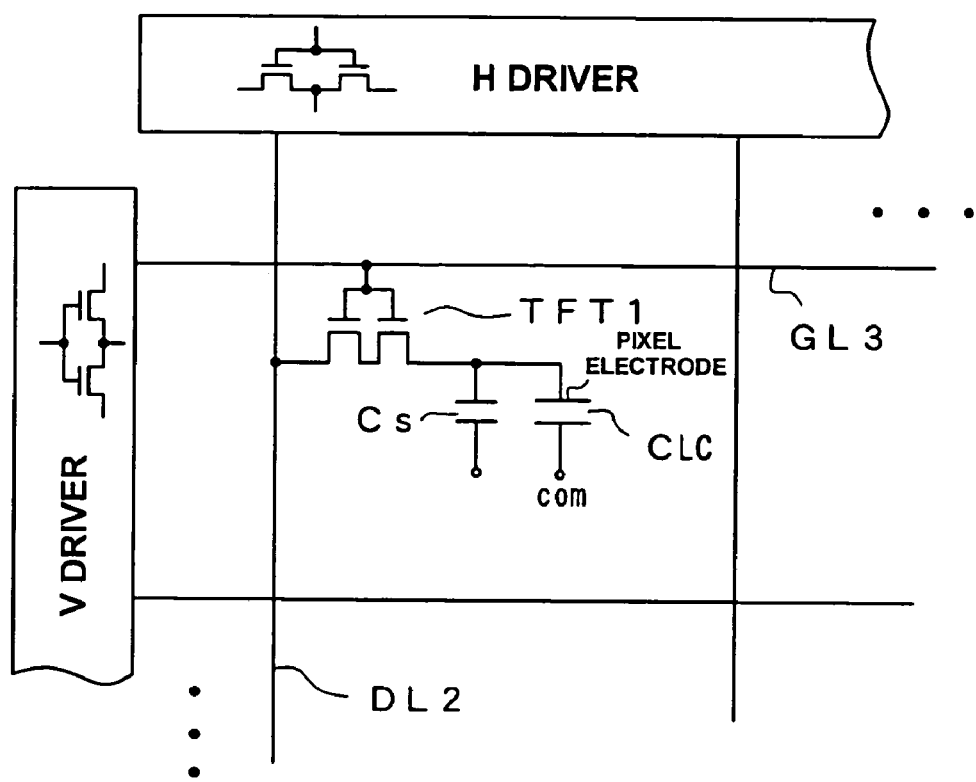
FIG. 8 is a schematic diagram of a circuit structure in the active matrix LCD according to a fourth embodiment of the present invention.

FIG. 8 schematically illustrates a circuit configuration of an active matrix LCD in which TFTs according to the present embodiment are used for a pixel switching element and a driver circuit element. The LCD is formed by liquid crystal sealed between a pair of substrates, and includes in a display portion of one of the substrates a plurality of pixels disposed in a matrix, an individual pixel electrode disposed for each pixel, a TFT 1 of a double gate type having a poli-Si active layer and connected to the pixel electrode to act as a pixel switch, a data line DL 2 for supplying a data signal to the TFT 1, and a gate line GL 3 for selecting and operating the TFT 1. An H driver and a V driver are disposed as driver circuits outside the display portion of the substrate. Both drivers are provided with the TFT having a poli-Si active layer same as the pixel portion TFT. The H driver outputs a display data signal to each data line at a predetermined timing while the V driver sequentially outputs a gate signal to the gate line GL 3. An opposite electrode is formed over the other substrate of the LCD, and a pixel capacitor (liquid crystal capacitor) $C_{LC}$ is formed between the opposite electrode and each pixel electrode. A storage capacitor Cs is provided for each pixel connected to the pixel TFT 1 in parallel to the liquid crystal capacitor $C_{LC}$ for supporting electric charge storage in the liquid crystal capacitor $C_{LC}$ during one display period.

The steps of manufacturing the TFT according to the present embodiment used as the pixel switching element and the driver circuit element as illustrated in FIG. 8 will next be described with reference to FIGS. 9A–9C and FIGS. 10A–10C. The TFT illustrated in these figures are the TFTs of the CMOS configuration formed in a driver region of an active matrix LCD and the pixel TFTs formed in the pixel region thereof.

On the glass substrate 10, an unillustrated buffer layer composed of, for example, an $SiN_x$ film and an $SiO_2$ film is formed, and the a-Si layer 12 is formed on the buffer layer. The a-Si layer 12 is irradiated with excimer laser beams for a polycrystallization annealing process. The poli-Si layer produced by such annealing is then patterned to the shape of the active layer 14 in each TFT (FIG. 9A).

While as the next step the gate insulating film of $SiO_2$ or the like is formed covering the active layer 14 in the related art, according to the present embodiment a resist layer 20 covering a predetermined region of the active layer 14 is formed as illustrated in FIG. 9B as a mask for impurity doping prior to formation of the gate insulating film. The resist layer 20 is a positive resist of, for example, a novolac resin type. The pattern illustrated in FIG. 9B is obtained by providing on the entire substrate a resist material directly covering the active layer 14, and selectively leaving the resist layer utilizing photoresist. In the present embodiment, the resist layer 20 covers the regions which will be a channel of an n-channel TFT and an LD (lightly doped) region, and the entire active layer 14 region of a p-channel TFT.

After thus forming and patterning the resist layer 20, n-conductivity type impurities, such as phosphorous, are directly doped to the active layer 14 at a high concentration using the resist layer 20 as a mask, thereby forming high concentration impurity regions ($N^+$ regions) acting later as the source and drain regions 14s and 14d. The region of the active layer 14 uncovered with the resist layer 20 has an exposed surface during doping, whereby the impurities can directly be implanted to the exposed active layer 14. As a result, the impurities require acceleration energy just enough to reach a predetermined depth of the active layer 14, and therefore the energy is significantly smaller than that required for doping through the gate insulating film as in the related art.

After the doping of the impurities into the active layer 14 at a high concentration using the resist layer 20 as a mask, the resist layer 20 is removed by, for example, ashing and wet stripping. While the impurities are doped at a high concentration using the resist layer 20 as a mask as described above, the acceleration energy of the implanted impurities can be minimized in the present embodiment, and doping under such conditions allows complete removal of the resist layer 20 without leaving any residue. It should be noted that, for an n-channel TFT in which p-conductivity type impurities are doped to its channel at a low concentration, doping is performed prior to formation of the resist layer 20.

Figure 10A:
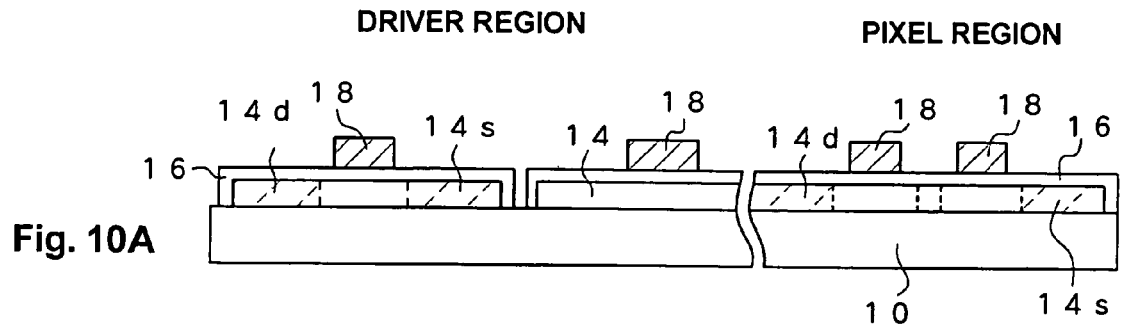
FIGS. 10A, 10B, and 10C are views illustrating the steps of manufacturing the TFT following the step illustrated in FIG. 9C according to the fourth embodiment of the present invention.

After removing the resist layer 20 from the surface of the active layer 14, a gate insulating film 16 is formed covering the active layer 14, as illustrated in FIG. 9C. A gate electrode material is then provided on the gate insulating film 16 and patterned to the desired shape of a gate electrode 18, as illustrated in FIG. 10A.

Figure 10B:
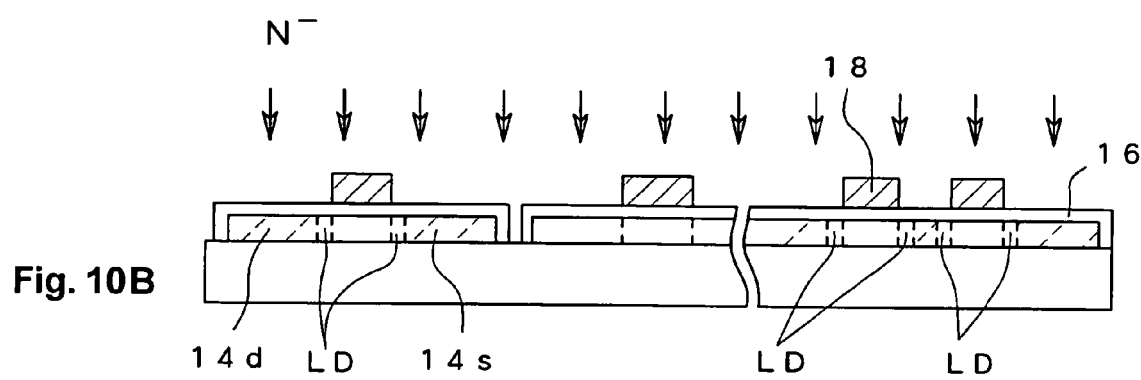
Figure 10C:
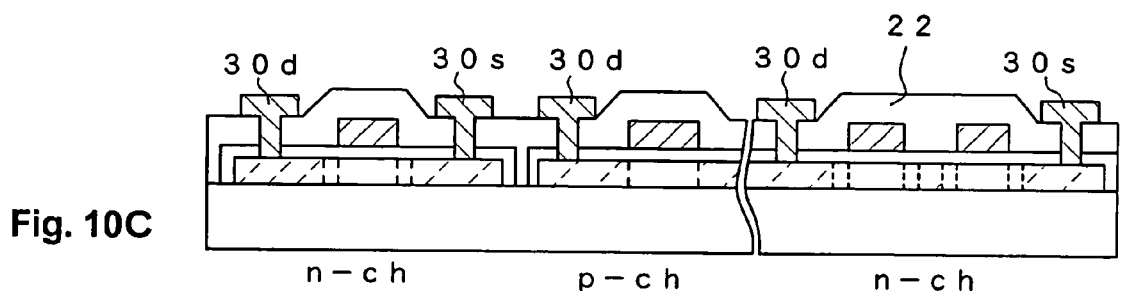

After patterning the gate electrode 18, n-conductivity type impurities, such as phosphorous, are doped to the active layer 14 through the gate insulating film 16 at a low concentration using the gate electrode 18 as a mask, as illustrated in FIG. 10B. As a result, the impurities are selectively doped at a low concentration to just the region uncovered with the gate electrode 18 but covered with the resist layer 20 during high concentration doping. In other words, a low concentration impurity (lightly doped; LD) region ($N^-$ region) is formed on either side of the region (channel region) immediately below the gate electrode between the channel region and the $N^+$ region (14s, 14d) of the active layer 14 in a self-aligned manner with respect to the gate electrode 18.

As described above, with the present embodiment, because the LD region can be formed such that its boundary with the channel region is self-aligned with respect to the gate electrode 18, the alignment allowance provided in view of displacement of the mask resist layer need not be greater than in the related method of manufacturing an LDD TFT. The width of the $N^-$ region from the end of the channel region immediately below the gate electrode (LD distance) varies with displacement of the resist layer 20 and the gate electrode 18. However, when the gate electrode is displaced, for example, toward the source in the configuration of FIG. 10B, the LD distance between the channel region and the source region 14s is reduced from the target value while the LD distance between the channel region and the drain region 14d is increased from the target value by that displaced distance. Consequently, the distance between the source and the drain is not varied by displacement, and variations in on-current on the source and drain sides are canceled by each other, so that the on-current of the TFT remains the same. Further, the LD distance is determined beforehand in view of displacement of the mask, and therefore the off-current, i.e. leakage current, is suppressed to a sufficiently small value even with mask displacement, ensuring achievement of a sufficiently high reliability of the TFT.

It should be noted that, at the step of doping phosphorous ions at a low concentration illustrated in FIG. 10B, doping is performed without particularly masking the p-ch TFT because the presence of phosphorous ions (N-conductivity type) in the active layer of the p-ch TFT formed on the same substrate does not significantly affect electric properties as long as the concentration thereof is small. However, the region for forming the p-ch TFT may be covered with the resist layer during doping. When phosphorous ions are doped at a low concentration while covering the region for forming the p-ch TFT with the resist layer, the resist layer is exposed to ions accelerated enough to penetrate the gate insulating layer 16. However, eventual damage (curing) on the resist layer can be minimized even when ions are given a high acceleration energy, as long as the concentration is low. Consequently, this resist layer can be removed as much as the mask resist layer used for forming the high concentration regions 14s and 14d, i.e. the layer can completely be removed.

Although not illustrated in the figures, the region for forming the n-ch TFT is masked for doping p-conductivity type impurities, such as boron (B), into the active layer 14 of the p-ch TFT after doping the n-conductivity impurities into the active layer 14 of the n-ch TFT. Naturally, the p-conductivity type impurities are also preferably doped prior to formation of the gate insulating layer 16 as described above. However, when boron ions are subjected to mass spectrometry and doped, i.e. subjected to ion implantation, the resist mask doped with boron ions receives only a relatively slight damage because boron ions are smaller in size than phosphorous ions. In other words, the resist mask doped with boron ions at high energy and concentration is less easily cured than that doped with phosphorous ions at high energy and concentration. In addition, because the step of further doping impurities is not necessary after boron ion doping, effects on the subsequent steps is small even though the resist is cured to some extent. Therefore, the p-conductivity type impurities, such as boron (B), can be doped to the active layer 14 of the p-ch TFT while masking the region for forming the n-ch TFT as described above.

After doping of impurities to all necessary regions as described above, an activation annealing process for activating the doped impurities is performed. After such an impurity activation process, the interlayer insulating film 22 is formed covering the entire substrate including the gate electrode 18, followed by formation of the contact holes penetrating the regions of the interlayer insulating film 22 and the gate insulating film 16 corresponding to the source and drain regions 14s and 14d. The electrode material is then provided and patterned, thereby forming the source electrode 30s and the drain electrode 30d connected to the source and drain regions 14s and 14d, respectively, through the above contact holes, or a signal wiring integral with such electrodes.

Figure 11:
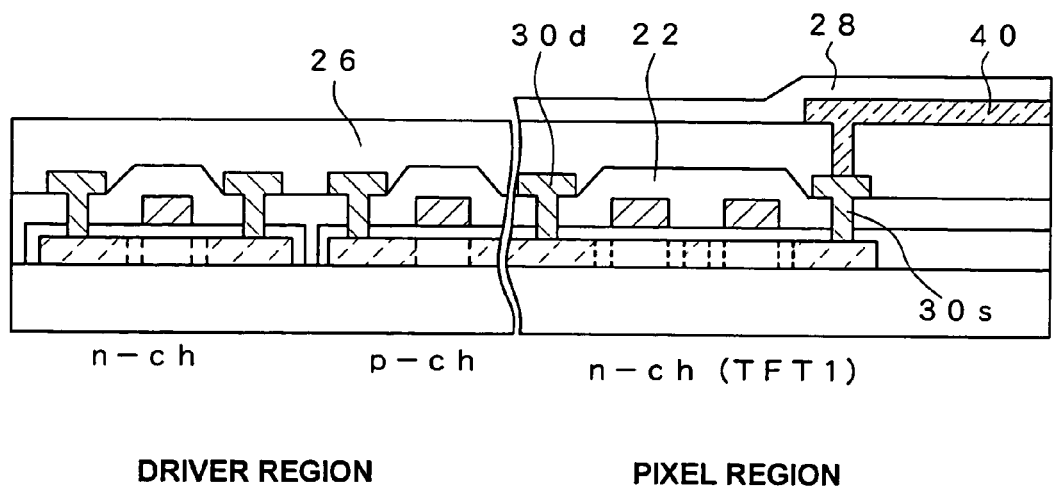
FIGS. 11 and 12 illustrate examples of applying to the active matrix display device the TFTs according to fourth and fifth embodiments of the present invention.

After thus forming the source electrode 30s and the drain electrode 30d, the planarization insulating film 26 of a resin material, such as an acrylic resin, is formed covering the entire substrate surface as illustrated in FIG. 11, and a contact hole is formed in the region of this film corresponding to the source electrode 30s. A pixel electrode material, such as ITO, is provided and patterned to the shape of each pixel, thereby forming the pixel electrode 40. Finally, the alignment film 28 is formed covering the entire substrate surface, thereby completing formation of a first substrate. After the first substrate is formed, it is affixed to a second substrate on which the common electrode, the alignment film, and the like are formed, and liquid crystal is sealed between these substrates, thereby completing formation of the LCD cell.

Figure 12:
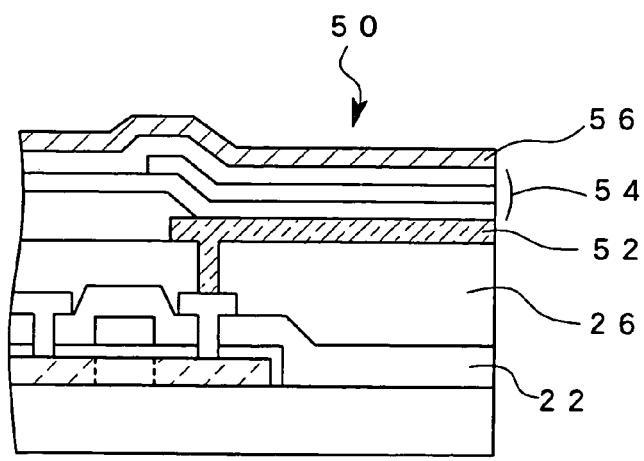

The above-described TFT can also be used for each pixel TFT and a driver circuit TFT in an active matrix OLED employing an organic EL element as a display element. Referring to FIG. 12, an organic EL element 50 includes an organic layer 54 including at least an emissive layer of an organic compound (such as stacked layers of a hole transportation layer, an emissive layer, and an electron transportation layer) provided between an anode 52 and a cathode 56 of a metal material, such as Al.

For OLED applications, the TFT may be formed through steps similar to those illustrated in FIGS. 9A–9C and FIGS. 10A–10C, and thereafter the planarization insulating film 26 of a resin material, such as an acrylic resin, is formed covering the entire substrate surface including the source electrode 30s and the drain electrode 30d of each TFT, as illustrated in FIG. 11. A contact hole is then made in the region corresponding to the source or drain electrode of the TFT for providing the organic EL element 50 with electric current, and a transparent conductive material, such as ITO, is provided as an anode material and patterned to the shape of each pixel, thereby forming an anode separate for each pixel (pixel electrode) 52. Thus, the TFT according to the fourth embodiment of the present invention can also be applied to an active matrix OLED.

An example of the relationship between impurity doping conditions and stripping properties of the resist layer used as a mask will next be described. When ions are doped to the poli-Si active layer 14 using $PH_3$ at a concentration of 5%, formation of the $N^+$ region through the gate insulating film 16 (hereinafter referred to as "through-doping") as in the related art requires the acceleration energy of approximately 90 keV and the phosphorus ion concentration of approximately $6 \times 10^{14}$ $cm^{-2}$ on the implanting side. On the other hand, directly doping ions into the active layer 14 without the gate insulating layer 16 lying in between as in the present embodiment (hereinafter referred to as "direct doping") only requires the maximum acceleration energy of 15 keV and the phosphorus ion concentration of approximately $2 \times 10^{14}$ $cm^{-2}$ on the implanting side.

The resist layer (FIG. 7C) under the conditions of through-doping in the related art (90 keV, $6 \times 10^{14}$ $cm^{-2}$) cannot be completely removed by ashing and wet stripping, and portions remain after ashing and wet stripping. On the other hand, the resist layer (FIG. 9B) under the conditions of direct doping according to this fourth embodiment (15 keV, $2 \times 10^{14}$ $cm^{-2}$) can be completely removed by ashing and wet stripping without leaving any residue. Such direct doping allows use of decreased acceleration energy and ion concentration, thereby reliably reducing manufacturing costs.

While in this fourth embodiment for the low concentration impurity doping to the LD region, the impurities are doped to the active layer 14 through the gate insulating film 16 similarly to the related art as described above, the doping is performed under the conditions of the acceleration energy of approximately 90 keV and the P ion concentration of $3 \times 10^{15}$ $cm^{-2}$. Thus, although the acceleration energy is approximately on the same level as the high concentration through-doping, the doped ion concentration is reduced by one digit. Therefore, the resist layer subjected to such ion doping environment, such as the layer covering the p-ch TFT formation region in a driver circuit, achieves the stripping properties almost equivalent to that observed in the direct doping into the $N^+$ region.

The regions of the gate insulating film 16 corresponding to the $N^+$ region and $N^-$ region are subjected to the same ion doping environment because the impurities are doped at a high concentration prior to formation of the gate insulating film 16 according to the fourth embodiment. Under the above-described direct doping conditions, the concentration of phosphorous doped to the $N^+$ region of the active layer 14 is approximately $1 \times 10^{19}$ $cm^{-3}$, and that of phosphorous doped to the $N^-$ (LD) region of the active layer 14 is approximately $1 \times 10^{18}$ $cm^{-3}$. On the other hand, because doping through the gate insulating film 16 is performed only at a low concentration, the phosphorous concentration in the gate insulating film 16 is approximately $1 \times 10^{17}$ $cm^{-3}$ at both regions of the film 16 corresponding to the $N^+$ region and $N^-$ region. The phosphorous concentration in the gate insulating film is generally determined by the phosphorous ions staying in the film during low concentration doping illustrated in FIG. 10B. On the other hand, when high concentration doping is performed through the gate insulating film 16 as in the related art, the region of the gate insulating film 16 corresponding to the $N^+$ region is subjected to both high concentration doping and low concentration doping, and therefore the concentration in this region exceeds that of phosphorous in the film at the region of the film 16 corresponding to the $N^-$ region. As a result, the phosphorous concentration of the region of the film 16 corresponding to the $N^+$ region reaches, for example, $1 \times 10^{18}$ $cm^{-3}$ or higher. Thus, while the gate insulating film 16 in the related art has a high phosphorous concentration and is therefore associated with concerns, such as a decrease in withstanding voltage of the TFT and damages, there is no such concern when the method of this fourth embodiment is employed.

Fifth Embodiment

Similarly as in the above-described fourth embodiment, curing of the doping mask layer during impurity doping at a high concentration is also prevented in a fifth embodiment. Further, in the fifth embodiment is provided a method of preventing such curing, which makes it difficult to remove the ion doping mask, in a p-ch TFT in addition to an n-ch TFT in a device where the n-ch TFT and the p-ch TFT are both formed on the same substrate utilizing the poli-Si TFTs. The fifth embodiment of the present invention will be described below with reference to the drawings referring to the same numerals and characters for the components described with reference to the above-described first through fourth embodiments.

The poli-Si TFT facilitates fabrication of a CMOS circuit as described above, and therefore is used for a pixel switch (a pixel TFT) in a high-definition display, a display device provided with a driver circuit for driving a display portion and including a CMOS circuit formed by TFTs similar to the pixel TFT on the same substrate, and the like.

Figure 13A:
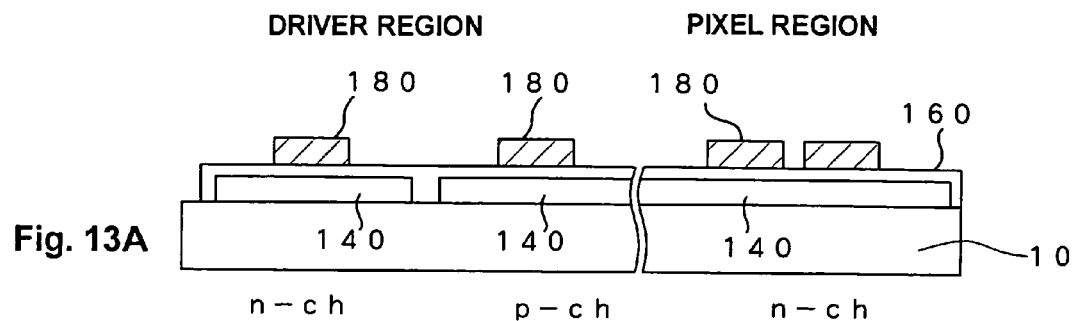
FIGS. 13A, 13B, 13C, and 13D are views for explaining the steps of manufacturing n-channel and p-channel TFTs formed on the same substrate according to a related art.

FIGS. 13A–13D illustrate the steps of manufacturing a pixel TFT in such an LCD including a driver and TFTs of the CMOS configuration in the driver circuit according to a related art. First, an a-Si layer is formed on a glass substrate, and polycrystallized through laser annealing. The produced poli-Si layer is patterned to the shape of the active layer 140 for each TFT, and the gate insulating film 160 is formed of $SiO_2$ or the like covering the active layer 140. After such formation of the gate insulating film 160, a gate electrode material is provided and patterned to the shape of the gate electrode 180 as illustrated in FIG. 13A.

The n-ch TFT is used as one TFT of the CMOS circuit in the driver circuit and as the pixel TFT. As described in connection with the fourth embodiment, in the n-ch TFT of the driver circuit, degradation in characteristics of the TFT due to hot carriers (electrons) resulting from less dense properties of the gate insulating film formed at a low temperature must be prevented, and in the n-ch TFT for pixels leakage current caused by crystal defects often observed in poli-Si must be reduced. As a result, for the n-ch TFT of poli-Si formed at a low temperature an LDD (lightly doped drain) configuration where a low concentration impurity region is provided between the drain and channel regions is employed.

Because the n-ch TFT is of such an LDD configuration, after the gate electrode 180 is patterned, the resist layer 200n acting as a mask is selectively etched so that the remaining layer 200n covers and extends over the gate electrode 180 longer by a predetermined distance than the electrode length (horizontal direction in FIG. 13B) of the gate electrode 180 in the n-ch TFT region, and covers the entire p-ch TFT region. Next, n-conductivity type impurities, such as phosphorous, are doped at a high concentration through the gate insulating film 160, thereby forming high concentration impurity regions ($N^+$ regions), which will later act as the source region 140s and the drain region 140d, in the areas uncovered with the resist layer 200n.

Figure 13B:
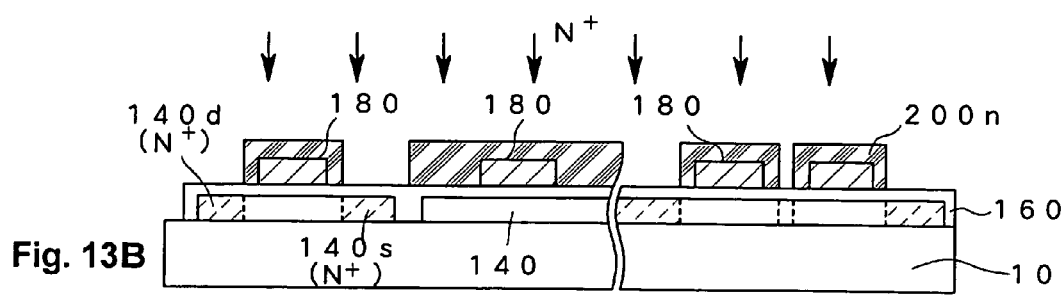
Figure 13C:
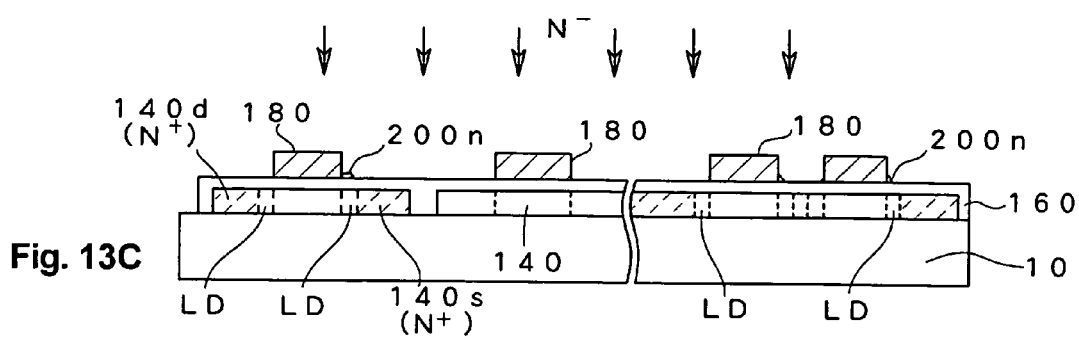

The resist layer 200n is then removed, and n-conductivity type impurities are doped to the active layer 140 at a low concentration through the gate insulating film 160 using the exposed gate electrode 180 as a mask, as illustrated in FIG. 13C. As a result, a low concentration impurity (lightly doped; LD) region ($N^-$ region) is formed between the $N^+$ region and an intrinsic region of the active layer 140 located immediately below the gate electrode 180.

Figure 13D:
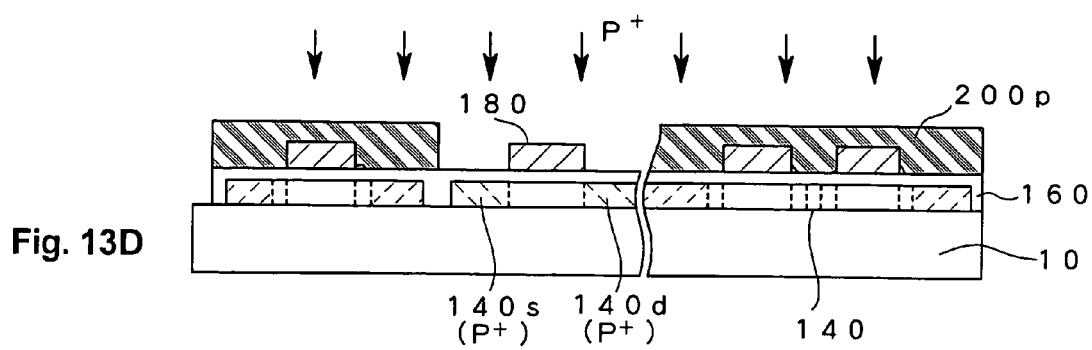

After impurity doping into the active layer 140 of the n-ch TFT, a resist layer 200p selectively covering the region for forming the n-ch TFT is formed, as illustrated in FIG. 13D. Using the gate electrode 180 as a mask, p-conductivity type impurities, such as boron, are doped to the active layer 140 of the p-ch TFT at a high concentration through the gate insulating film 160.

After doping impurities to the active layers 140 of the n-ch TFT and p-ch TFT, the interlayer insulating film 22 is formed covering the entire substrate surface including the gate electrode 180, and annealing is performed to activate the impurities. Contact holes are formed in a required region penetrating the above-described interlayer insulating film 22 and the gate insulating film 160, and electrode and wiring materials are provided and patterned, thereby forming the source electrode and the drain electrode connected to the source region 140s and the drain region 140d, respectively, in the above contact holes.

Through the above-described steps, the n-ch and p-ch TFTs of the top gate type can be formed on the same substrate.

When impurities are doped at a high concentration to the active layer 140 of each of the n-ch and p-ch TFTs, impurities are accelerated at a high energy so as to reach the active layer 140 through the gate insulating film 160. However, exposure to highly accelerated impurities at a high concentration results in excessive curing of resist resins commonly used for the resist layer 200 (200n, 200p).

Such curing is observed not only in the resist layer 200n formed for high concentration impurity doping into the source and drain regions 140s and 140d of the n-ch TFT illustrated in FIG. 13B but also in the resist layer 200p formed for covering the n-ch TFT when p-conductivity type impurities are doped at a high concentration into the source and drain regions 140s and 140d of the p-ch TFT illustrated in FIG. 13D.

In a device where the n-ch TFT and the p-ch TFT are both formed on the same substrate as described above, when impurities are doped at a high concentration for forming a TFT of one conductivity type, the TFT of the other conductivity type must be covered with the resist mask. Accordingly, adverse effects of curing of the resist layer as described above cannot be avoided in the manufacturing method of the related art.

On the other hand, according to this fifth embodiment, when a plurality of types of top gate transistors having different conductivity types are manufactured, the layer to be formed as a gate electrode of a transistor of one conductivity type is not patterned but rather is used as a mask layer for covering the active layer while impurities of the other conductivity type is doped at a high energy. Such a method reliably prevents curing of a layer acting as a mask during impurity doping, and the method of the fifth embodiment is excellent for manufacturing each pixel TFT, and a CMOS TFT in a driver circuit simultaneously formed as the pixel TFT on the same substrate in an active matrix display device. The schematic circuit configuration of an active matrix LCD in which the TFTs according to this fifth embodiment are used for a pixel switching element and a driver circuit element is as illustrated in FIG. 8 described above.

A method of manufacturing TFTs of a plurality of conductivity types used as pixel TFTs and driver circuit TFTs according to this fifth embodiment will next be described with reference to FIGS. 14A–14D and FIGS. 15A–15D. The TFTs illustrated in FIG. 14A through FIG. 15D are TFTs of the CMOS configuration formed in a driver region and a pixel TFT in a pixel region of an active matrix LCD.

Figure 14A:
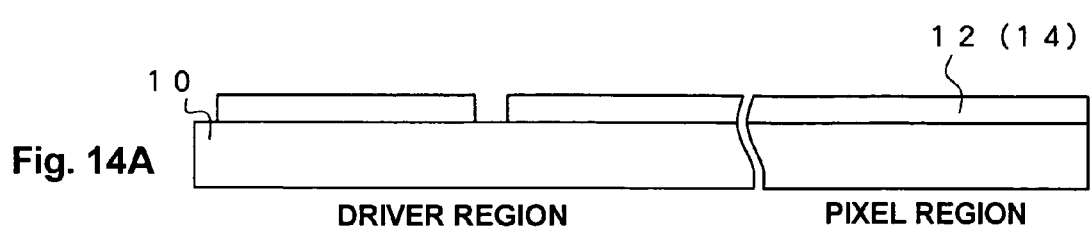
FIGS. 14A, 14B, 14C, and 14D are views illustrating the steps of manufacturing the TFT according to the fifth embodiment of the present invention.

On the glass substrate 10, an unillustrated buffer layer composed of, for example, an $SiN_x$ film and an $SiO_2$ film is formed, and the a-Si layer 12 is formed on the buffer layer. The a-Si layer 12 is irradiated with excimer laser beams for a polycrystallization annealing process. The poli-Si layer produced by such annealing is then patterned to the shape of the active layer 14 in each TFT (FIG. 14A).

Figure 14B:
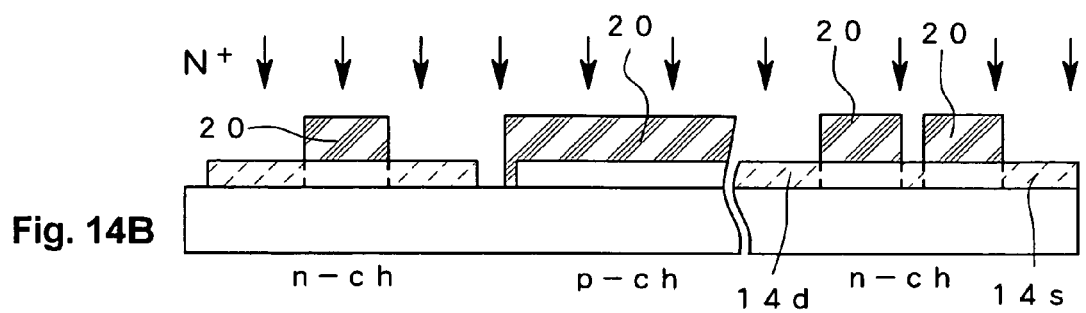

While in the next step according to the related art the gate insulating film of $SiO_2$ or the like is formed covering the active layer 14, according to the fifth embodiment of the present invention a resist layer 20 covering a predetermined region of the active layer 14 is formed as illustrated in FIG. 14B as a mask for impurity doping prior to formation of the gate insulating film. The resist layer 20 is a positive resist of, for example, a novolac resin type. The pattern illustrated in FIG. 14B is obtained by providing on the entire substrate a resist material directly covering the active layer 14, and selectively leaving the resist layer utilizing photoresist. In the present embodiment, the resist layer 20 covers the regions which will be a channel of an n-channel TFT and an LD (lightly doped) region adjacent to the channel, and the entire active layer 14 region of the p-channel TFT.

After thus forming and patterning the resist layer 20, n-conductivity type impurities, such as phosphorous, are directly doped to the active layer 14 at a high concentration using the resist layer 20 as a mask, thereby forming high concentration impurity regions ($N^+$ regions) acting later as the source and drain regions 14s and 14d. The region of the active layer 14 uncovered with the resist layer 20 has an exposed surface during doping, whereby the impurities can directly be implanted to the exposed active layer 14. Consequently, as described with reference to the fourth embodiment, the impurities require acceleration energy just enough to reach a predetermined depth of the active layer 14, and therefore the energy is significantly smaller than that required for doping through the gate insulating film.

After doping the impurities into the active layer 14 at a high concentration using the resist layer 20 as a mask, the resist layer 20 is removed by, for example, ashing and wet stripping. While the impurities are doped at a high concentration using the resist layer 20 as a mask as described above, the acceleration energy of the implanted impurities can be minimized in the present embodiment, and doping under such conditions allows complete removal of the resist layer 20 without leaving any residue. It should be noted that, for an n-channel TFT in which p-conductivity type impurities are doped to its channel at a low concentration, doping is performed prior to formation of the resist layer 20.

Figure 14C:
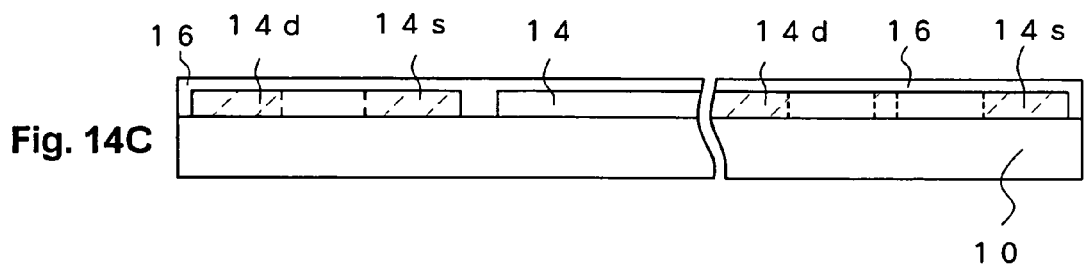

After removing the resist layer 20 from the surface of the active layer 14, the gate insulating film 16 is formed through CVD covering the active layer 14, as illustrated in FIG. 14C.

Figure 14D:
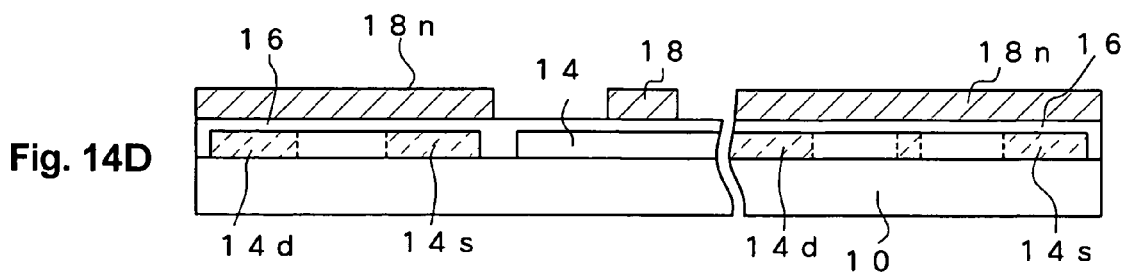

On the gate insulating film 16, a gate electrode material layer of a refractory metal, such as Mo and Cr, is provided. As illustrated in FIG. 14D, the gate electrode material layer covers at least the entire region of the active layer 14 of the TFT to act as a mask layer $18_{MA}$ in the region where the n-ch TFT is formed, and is patterned to the shape of a gate electrode 18p in the region where the p-ch TFT is formed (first patterning of the gate electrode). When all the pixel TFTs are formed as the n-ch TFTs, although the mask layer $18_{MA}$ may individually cover each pixel TFT disposed as an island, patterning the mask layer $18_{MA}$ to cover the entire pixel region allows less accurate patterning of the mask layer $18_{MA}$ and the like, and is therefore preferable in view of simplifying the manufacturing process.

Figure 15A:
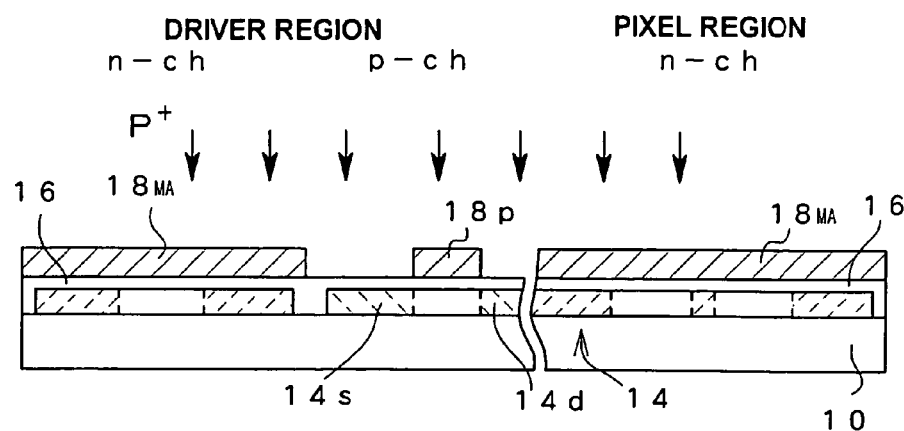
FIGS. 15A, 15B, 15C, and 15D are views illustrating the steps of manufacturing the TFT following the step illustrated in FIG. 14D according to the fifth embodiment of the present invention.

After the first patterning of the gate electrode, p-conductivity type impurities, such as boron, are doped at a high concentration to the active layer 14 through the gate insulating film 16 using as masks the mask layer $18_{MA}$ in the n-ch TFT formation region and the gate electrode 18p in the p-ch TFT formation region, as illustrated in FIG. 15A. As a result, the p-conductivity type impurities are selectively doped to the active layer 14 in the p-ch TFT formation region, thereby forming p-conductivity type impurity doped regions ($P^+$ regions) acting as the source and drain regions 14s and 14d in a self-aligned manner with respect to the gate electrode 18p. It should be noted that in the n-ch TFT formation region the active layer 14 is covered with the mask layer $18_{MA}$ formed of the gate electrode material layer to prevent doping of the p-conductivity type impurities.

Figure 15B:
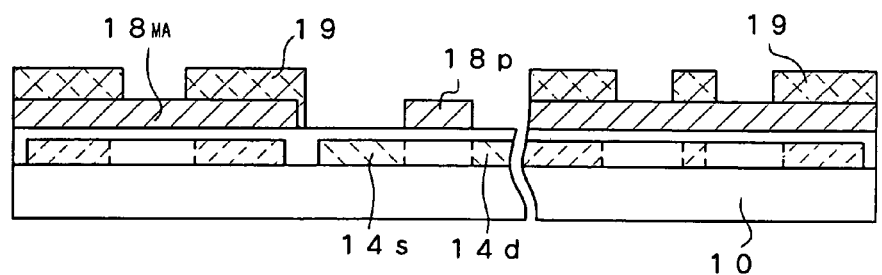
Figure 15C:
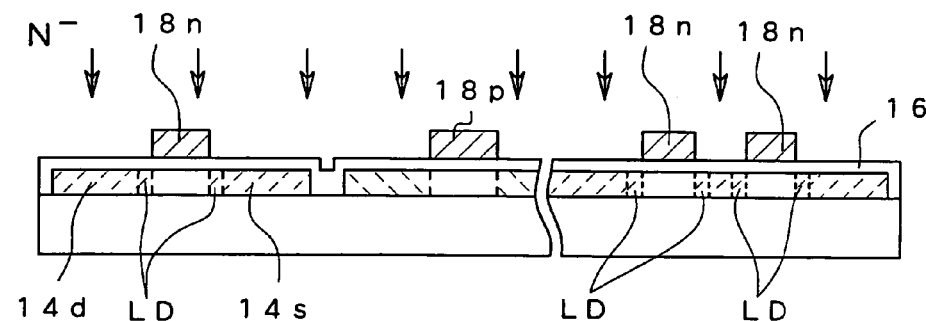

After doping the p-conductivity type impurities, the mask layer (gate electrode material layer) $18_{MA}$ covering the active layer 14 of the n-ch TFT is patterned to the shape of the gate electrode of the n-ch TFT (second patterning of the gate). More specifically, for example, a photosensitive resist layer is formed on the entire substrate surface, and through photolithography a resist layer 19 is left only in the region corresponding to the region to be removed (the region excluding the gate electrode and wiring) of the mask layer $18_{MA}$ covering the n-ch TFT formation region, as illustrated in FIG. 15B. Dry etching is performed using an etching gas with selective etching properties for the resist layer 19, thereby selectively etching away the resist layer 19 and the mask layer $18_{MA}$ covered with the resist layer 19. Through such an etching process, a gate electrode 18n in a desired pattern can also be formed in the n-ch TFT formation region. For alignment allowance, the resist layer 19 is formed slightly larger than the region where the mask layer $18_{MA}$ should actually be removed. Consequently, after the second patterning of the gate electrode, the surface of the gate insulating film 16 is slightly etched in a region surrounding the active layer 14 of the n-ch TFT, as illustrated in FIG. 15C. The mask layer $18_{MA}$ may be removed by wet etching to obtain a desired pattern of the gate electrode 18n.

Figure 15D:
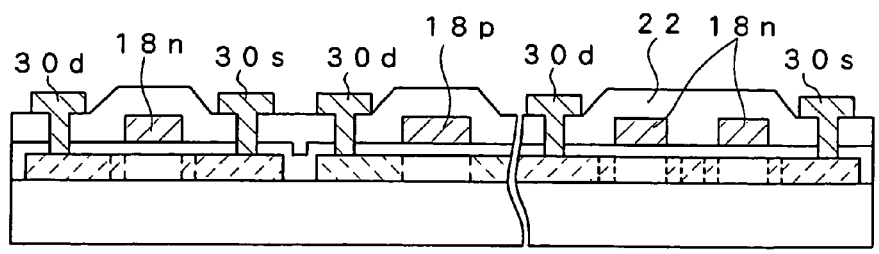

After patterning the gate electrode 18n of the n-ch TFT, n-conductivity type impurities are doped at a low concentration using the gate electrode 18n as a mask, as illustrated in FIG. 15D. Through this doping process, the impurities are selectively doped at a low concentration to only the area of the n-ch TFT region uncovered with the gate electrode 18n but covered with the resist layer 20 during high concentration doping of the n-conductivity type impurities. In other words, a low concentration impurity (lightly doped; LD) region ($N^-$ region) is formed on either side of the region immediately below the gate electrode (channel region) between the channel region and the $N^+$ region (14s, 14d) of the active layer 14 in a self-aligned manner with respect to the gate electrode 18n. As described above, the LD region can be formed with its boundary with the channel region self-aligned with respect to the gate electrode 18n, so that alignment allowance provided in view of displacement of the mask resist layer need not be especially increased as compared with the manufacturing method of the related art. The width of the $N^-$ region from the end of the channel region immediately below the gate electrode 18n (LD distance) varies with displacement of the resist layer 20 and the gate electrode 18n. When the gate electrode 18n is displaced toward the source in the configuration of FIG. 15D, for example, the LD distance between the channel region and the source region 14s is reduced from the target value while the LD distance between the channel region and the drain region 14d is increased from the target value by that displaced distance. Consequently, the distance between the source and the drain is not varied by displacement, and variations in on-current on the source and drain sides are canceled by each other, so that the on-current of the TFT remains the same. Further, the LD distance is determined beforehand in view of displacement of the mask, and therefore the off-current, i.e. leakage current, is suppressed to a sufficiently small value even with mask displacement, ensuring achievement of a sufficiently high reliability of the TFT.

It should be noted that presence of n-conductivity type impurities (such as phosphorous ions) in the active layer of the p-ch TFT does not significantly affect electric properties as long as the concentration thereof is small. Therefore, in this fifth embodiment, at the step of doping n-conductivity type impurities at a low concentration, doping may be performed without masking the p-ch TFT, as illustrated in FIG. 15C. However, the region for forming the p-ch TFT may be covered with the resist layer during doping. Although the resist layer is exposed to ions accelerated enough to penetrate the gate insulating film 16, the doping concentration is low and therefore damage (curing) on the resist layer is small, thereby ensuring complete removal of the resist layer.

After thus doping impurities to the necessary regions of the n-ch TFT and the p-ch TFT, the interlayer insulating film 22 is formed covering the entire substrate including the gate electrodes 18n and 18p. An activation annealing process is then performed to activate the doped impurities. In the present embodiment, hydrogenation annealing for introducing hydrogen contained in the gate insulating film 16 and the interlayer insulating film 22 to the poli-Si active layer to terminate crystal defects in the active layer is performed simultaneously with the activation annealing process.

After such an annealing process, contact holes are formed penetrating the interlayer insulating film 22 and the gate insulating film 16 at the regions corresponding to the source and drain regions 14s and 14d. An electrode material, such as Al, is provided and patterned, thereby forming the source electrode 30s and the drain electrode 30d connected to the source and drain regions 14s and 14d, respectively, through the above contact holes, or a signal wiring integral with such electrodes, as illustrated in FIG. 15D.

After thus forming the source electrode 30s and the drain electrode 30d, the planarization insulating film 26 of a resin material, such as acrylic resin, is formed covering the entire substrate surface as illustrated in FIG. 11 described above, and a contact hole is formed in the region corresponding to the source electrode 30s. A pixel electrode material, such as ITO, is provided and patterned to the shape of each pixel, thereby forming the pixel electrode 40. Finally, the alignment film 28 is formed covering the entire substrate surface, thereby completing formation of the first substrate of the LCD. After the first substrate is formed, it is affixed to the second substrate on which the common electrode, the alignment film, and the like are formed, and liquid crystal is sealed between these substrates, thereby completing formation of the LCD cell.

Similarly to the fourth embodiment, the TFT according to this fifth embodiment can also be used for each pixel TFT and a driver circuit TFT in an active matrix OLED employing an organic EL element as a display element. As illustrated in FIG. 12, the organic EL element 50 includes the organic layer 54 including at least an organic emissive layer provided between the anode 52 and the cathode 56.

The TFT employed in such an OLED may be formed through a process similar to that of this fifth embodiment as illustrated in FIG. 14A to FIG. 15D. Thereafter, the planarization insulating film 26 of a resin material, such as an acrylic resin, is formed covering the entire substrate surface including the source electrode 30s and the drain electrode 30d of each TFT as illustrated in FIG. 11. A contact hole is then made in the region corresponding to the source or drain electrode of the TFT for providing the organic EL element 50 with electric current, and a transparent conductive material, such as ITO, is provided as an anode material and patterned to the shape of each pixel, thereby forming an anode separate for each pixel (pixel electrode) 52.

The relationship between impurity doping conditions and stripping properties of the resist layer acting as a mask will next be described. When ions are doped to the poli-Si active layer 14 using $PH_3$ at a concentration of 5%, the through-doping in the related art requires an acceleration energy of approximately 90 keV and the phosphorus ion concentration of approximately $6\times10^{14}$ $cm^{-2}$ on the implanting side, as described in connection with the fourth embodiment. On the other hand, the direct doping method in which the gate insulating film 16 does not lie in between, also employed in the present embodiment, only requires a maximum acceleration energy of 15 keV and a phosphorus ion concentration of approximately $2\times10^{14}$ $cm^{-2}$ on the implanting side.

Further, as described in the fourth embodiment, the resist layer (FIG. 13B) exposed to the through-doping (90 keV, $6\times10^{14}$ $cm^{-2}$) cannot be completely removed by ashing and wet stripping, and a portion remains after ashing and wet stripping. On the other hand, also in this fifth embodiment, the direct doping method is employed (15 keV, $2\times10^{14}$ $cm^{-2}$) for doping n-conductivity type impurities at a high concentration, ensuring complete removal of the resist layer (FIG. 14B) through ashing and wet stripping without leaving any residue.

Further in this fifth embodiment, the n-ch TFT region is masked by the gate electrode material layer ($18_{MA}$) for doping p-conductivity type impurities at a high concentration (FIG. 15A). For such doping of p-conductivity type impurities, the impurities are accelerated at a high energy so as to pass through the already formed gate insulating film 16. However, in contrast to the resist material, the gate electrode material layer ($18_{MA}$) does not cure under such through-doping conditions, and no residue is left when the subsequent patterning process is initiated. It is confirmed from this fact that the problem of mask residue can easily be overcome by using the layer to be a gate electrode of a transistor of one conductivity type as a mask for covering the active layer without patterning when impurities of the different conductivity type is doped at a high energy.

In this fifth embodiment, the low concentration impurity doping to the LD region is performed under such conditions as to allow the impurities to pass through the gate insulating film 16, such as the acceleration energy of approximately 90 keV and the P ion concentration of approximately $3\times10^{13}$ $cm^{-2}$. Thus, as compared with the high concentration through-doping, although the acceleration energy is approximately on the same level, the doped ion concentration is reduced by one digit. Therefore, even when the p-ch TFT formation region of the driver circuit is covered with the resist mask during low concentration doping of the n-conductivity type impurities, it is only exposed to the low concentration impurities as described above, and the resist layer is only slightly cured and achieves sufficient stripping properties. Further, in this fifth embodiment, p-conductivity type impurities are already doped at a high concentration to the source and drain regions of the p-ch TFT (FIG. 15A) prior to the step of doping impurities at a low concentration to form the LD region as illustrated in FIG. 15C, and the characteristics of the TFT will not be significantly affected by low concentration doping of the n-conductivity type impurities to the source and drain regions of the p-conductivity type. As a result, for low concentration doping of the n-conductivity type impurities, the source and drain regions are not especially masked in the p-ch TFT, as in the n-ch TFT, and this step is performed using the patterned gate electrodes 18p and 18n as the masks for the respective channel regions. Therefore, there is no need to form a resist mask that may be cured more or less for low concentration impurity doping according to the method of this fifth embodiment.

Similarly as in the fourth embodiment, because the impurities are doped at a high concentration prior to formation of the gate insulating film 16, the regions of the gate insulating film 16 corresponding to the $N^+$ region and $N^-$ region are only subjected to low concentration doping of phosphorous, and the ion doping environment is the same, also in this fifth embodiment. Consequently, while the concentration of phosphorous doped to the $N^+$ region of the active layer 14 is approximately $1 \times 10^{19}$ cm$^{-3}$, and that of phosphorous doped to the $N^-$ region thereof is approximately $1 \times 10^{18}$ cm$^{-3}$, the concentration of phosphorous is approximately $1 \times 10^{17}$ cm$^{-3}$ at both regions of the gate insulating layer 16 corresponding to the $N^+$ region and $N^-$ region. Accordingly, while possible damage, such as a decrease in withstanding voltage of the TFT, is a major concern for the gate insulating film 16 having a high phosphorous concentration therein, such problems can be avoided when this fifth embodiment of the present invention is employed. It should be noted that the gate insulating film 16 of the n-ch TFT does not contain p-conductivity type impurities because the n-ch TFT formation region is masked by the gate electrode material layer during p-conductivity type impurity doping. On the other hand, when the gate insulating film 16 of the p-ch TFT is exposed to low concentration doping of the n-conductivity type impurities as described above, the film contains a small amount of n-conductivity type impurities and p-conductivity type impurities.

Effects of the Invention

According to the present invention, electrical connection between a pixel electrode formed on a thick film, such as a planarization film, and a semiconductor film used for an active layer of a TFT and the like is made by a plurality of contact holes formed in stages and contact material filling in the holes. As a result, even when the distance between the above layers of the pixel electrode and the semiconductor film is large, each contact hole can be made in a short etching time with a small aspect ratio and reduced areas of the upper and bottom surfaces, and the difference in area between the upper and bottom surfaces thereof is reduced, thereby achieving high level integration.

Further, the conductive material used for each contact often has a large selectivity with respect to the film etched away for opening the contact hole provided thereon, thereby allowing selective etching. Consequently, the properties of the film exposed at the bottom surface of the hole by etching can be prevented from degrading. Further, by simultaneously forming a first contact with a gate electrode and a second contact with wiring, contacts with a high reliability can be formed without increasing the number of manufacturing steps.

According to another aspect of the present invention, the resist mask used for impurity doping can be prevented from remaining after stripping. Because a channel region and a low concentration impurity region can be formed in a self-aligned manner with respect to the gate electrode, a transistor with a small area and a high reliability can be efficiently manufactured.

According to a further aspect of the present invention, when two kinds of TFTs with different conductivity types, such as the TFTs forming a CMOS configuration, are formed on the same substrate, the problem of residual doping mask material remaining after stripping can be completely overcome for each doping process of the impurities of the different conductivity types because impurities of one conductivity type are doped prior to formation of the gate insulating film while those of the other conductivity type are doped using the gate electrode material as a mask, even when they are doped after the gate insulating film is formed. Because a channel region and a low concentration impurity region can be formed in a self-aligned manner with respect to the gate electrode, a transistor with a small area and a high reliability can be efficiently manufactured.

INDUSTRIAL APPLICABILITY

The present invention is suitable for use in, for example, TFTs of color liquid crystal display devices, color display devices such as color EL display devices, and other semiconductor devices.

What is claimed is:

1. A method of manufacturing a thin film transistor, comprising:
   forming a semiconductor film as an island over an insulating substrate;
   forming a first insulating film on said insulating substrate and said semiconductor film covering said semiconductor film;
   forming at least one first contact hole penetrating said first insulating film and exposing part of said semiconductor film;
   forming a first conductive film on said first insulating film and in said first contact hole, and etching said first conductive film to simultaneously form a gate electrode overlapping part of said semiconductor film and a first contact electrically connected to said semiconductor film in said first contact hole;
   forming a second insulating film covering said first insulating film, said gate electrode, and said first contact;
   forming a second contact hole penetrating at least said second insulating film and exposing part of said first contact;
   forming a second conductive film on said second insulating film and in said second contact hole, and etching a predetermined area to form a wiring in a predetermined shape and a second contact, electrically connected to said first contact; and
   forming a second insulating film covering said first insulating film, said gate electrode, and said first contact;
   forming at least two second contact holes penetrating at least said second insulating film and exposing parts of said first contact and said semiconductor film; and
   forming a second conductive film on said second insulating film and in said second contact holes, and etching a predetermined area to form a wiring in a predetermined shape and a second contact, electrically connected to said semiconductor film.

2. A method of manufacturing an active matrix display device, comprising:
- forming a semiconductor film as an island on an insulating substrate;
- forming a first insulating film on said insulating substrate and said semiconductor film covering said semiconductor film;
- forming at least one first contact hole penetrating said first insulating film and exposing part of said semiconductor film;
- forming a first conductive film on said first insulating film and in said first contact hole, and etching said first conductive film to simultaneously form a gate electrode overlapping part of said semiconductor film and a first contact in said first contact hole electrically connected to said semiconductor film;
- forming a second insulating film covering said first insulating film, said gate electrode, and said first contact;
- forming at least two second contact holes penetrating at least said second insulating film and exposing parts of said first contact and said semiconductor film; and
- forming a second conductive film on said second insulating film and in said second contact holes, and etching a predetermined area to form a wiring in a predetermined shape and a second contact, electrically connected to said semiconductor film.

3. A method of manufacturing an active matrix display device according to claim 2, further comprising:
- forming, on said second insulating film, said second contact, and said wiring, a planarization film for planarizing an asperity formed by an underlying structure;
- forming a third contact hole penetrating said planarization film and exposing said second contact; and
- forming an electrode on said planarization film, electrically connected to said second contact through said third contact hole.

4. A method of manufacturing an active matrix display device, comprising:
- forming a semiconductor film as an island on an insulating substrate;
- forming a first insulating film on said insulating substrate and said semiconductor film covering said semiconductor film;
- forming at least one first contact hole penetrating said first insulating film and exposing part of said semiconductor film;
- forming a first conductive film on said first insulating film and in said first contact hole, and etching said first conductive film to simultaneously form a gate electrode overlapping part of said semiconductor film and a first contact in said first contact hole electrically connected to said semiconductor film;
- forming a second insulating film covering said first insulating film, said gate electrode, and said first contact;
- forming a second contact hole penetrating said second insulating film and exposing said first contact, and forming a third contact hole penetrating said second insulating film and said first insulating film and exposing said semiconductor film;
- forming a second conductive film on said second insulating film and in said second contact hole and said third contact hole, and etching a predetermined area to form a second contact electrically connected to said first contact, and a wiring in a predetermined shape electrically connected to said semiconductor film;
- forming, on said second insulating film, said second contact, and said wiring, a planarization film for planarizing an asperity formed by an underlying structure;
- forming a fourth contact hole penetrating said planarization film and exposing said second contact; and
- forming an electrode on said planarization film, electrically connected to said second contact through said fourth contact hole.

5. A method of manufacturing a top gate type transistor in which a gate electrode is formed in a layer overlying an active layer, wherein
- after said active layer is formed and, prior to formation of a gate insulating film covering said active layer, regions of said active layer to be a channel region and a low concentration impurity doped region are selectively covered with a resist mask material, and impurities are doped to said active layer at a high concentration,
- after said impurities are doped at a high concentration, said resist mask material is removed and then the gate insulating film is formed covering said active layer,
- the gate electrode is formed on said gate insulating film, and
- after said gate electrode is formed, impurities are doped to said active layer at a low concentration using said gate electrode as a mask.

6. A method of manufacturing a top gate type transistor according to claim 5, wherein
- said active layer is a polycrystalline silicon layer formed by providing and polycrystallizing an amorphous silicon layer.

7. A method of manufacturing a top gate type transistor in which a gate electrode is formed in a layer overlying an active layer, wherein
- after said active layer is formed and prior to formation of a gate insulating film covering said active layer, regions of said active layer to be a channel region and a low concentration impurity doped region are selectively covered with a resist mask material, and n-type impurities are doped to said active layer at a high concentration,
- after said n-type impurities are doped at a high concentration, said resist mask material is removed and then the gate insulating film is formed covering said active layer,
- the gate electrode is formed on said gate insulating film, and
- after said gate electrode is formed, said n-type impurities are doped to said active layer at a low concentration using said gate electrode as a mask.

8. A method of manufacturing a top gate type transistor according to claim 7, wherein
- said active layer is a polycrystalline silicon layer formed by providing and polycrystallizing an amorphous silicon layer.

9. A method of manufacturing a top gate type transistor according to claim 8, wherein
- on one substrate an active layer is formed of a polycrystalline silicon layer produced by a polycrystallizing process simultaneously performed with a polycrystallizing process of said active layer doped with said n-type impurities, and
- p-type impurities are doped to said active layer in a process different from the process of doping said n-type impurities.

10. A method of manufacturing top gate type transistors of conductivity types different from each other in which a gate electrode is formed in a layer overlying an active layer, wherein alter said active layer is formed and prior to formation of a gate insulating film covering said active layer, a resist mask is formed covering a channel formation region of said active layer and a low concentration impurity doped region formed adjacent to said channel formation region in a region for forming a transistor of a first conductivity type, and an active layer formation region in a region for forming a transistor of a second conductivity type, and then impurities of the first conductivity type are doped to said active layer at a high concentration, after said impurities of the first conductivity type are doped at a high concentration, said resist mask is removed and the gate insulating film covering said active layer is formed, a gate electrode material layer is formed on said gate insulating film, and said gate electrode material layer covers the entire active layer in said region for forming the transistor of the first conductivity type, and is patterned to a shape of the gate electrode in said region for forming the transistor of die second conductivity type, after patterning said gate electrode, impurities of the second conductivity type are doped to said active layer at a high concentration using said gate electrode as a mask, and after said gate electrode material layer in said region for forming said transistor of the first conductivity type is patterned to a shape of the gate electrode, said impurities of the first conductivity type are doped to said active layer at a low concentration using said gate electrode as a mask.

11. A method of manufacturing top gate type transistors according to claim 10, wherein said impurities of the first conductivity type are n-conductivity type impurities, and said impurities of the second conductivity type are p-conductivity type impurities.

12. A method of manufacturing a top gate type transistor in which a gate electrode is formed in a layer overlying an active layer made of a semiconductor film formed as an island, wherein:

after said active layer is formed and prior to formation of a gate insulating film covering said active layer, a desired region of said active layer is selectively covered with a resist mask material before doping impurities to said active layer;

after said impurities are doped, said resist mask material is removed and then said gate insulating film is formed covering said active layer;

at least one first contact hole penetrating said gate insulating film and exposing part of said active layer is formed;

a first conductive film is formed on said gate insulating film and in said first contact hole, and then said first conductive film is etched to form said gate electrode and a first contact electrically connected to said active layer in said first contact hole and made of material same as said gate electrode; and after covering a desired region with said resist mask material, impurities are doped to said active layer at a high concentration to form a source and drain regions.

* * * * *